United States Patent
Kaneko et al.

(10) Patent No.: US 12,038,689 B2
(45) Date of Patent: Jul. 16, 2024

(54) ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

(71) Applicant: FUJIFILM Corporation, Tokyo (JP)

(72) Inventors: Akihiro Kaneko, Haibara-gun (JP); Kazunari Yagi, Haibara-gun (JP); Takashi Kawashima, Haibara-gun (JP); Akiyoshi Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 608 days.

(21) Appl. No.: 17/212,546

(22) Filed: Mar. 25, 2021

(65) Prior Publication Data

US 2021/0216012 A1 Jul. 15, 2021

Related U.S. Application Data

(63) Continuation of application No. PCT/JP2019/031624, filed on Aug. 9, 2019.

(30) Foreign Application Priority Data

Sep. 28, 2018 (JP) ................. 2018-183900

(51) Int. Cl.
| | |
|---|---|
| G03F 7/039 | (2006.01) |
| C08F 212/14 | (2006.01) |
| C08F 220/18 | (2006.01) |
| C08F 220/28 | (2006.01) |
| C08F 220/36 | (2006.01) |
| C09D 125/18 | (2006.01) |
| C09D 133/10 | (2006.01) |
| C09D 133/16 | (2006.01) |
| G03F 7/004 | (2006.01) |
| G03F 7/30 | (2006.01) |
| G03F 7/38 | (2006.01) |

(52) U.S. Cl.
CPC .......... *G03F 7/0392* (2013.01); *C08F 212/22* (2020.02); *C08F 220/1808* (2020.02); *C08F 220/1809* (2020.02); *C08F 220/1812* (2020.02); *C08F 220/1818* (2020.02); *C08F 220/281* (2020.02); *C08F 220/282* (2020.02); *C08F 220/283* (2020.02); *C08F 220/365* (2020.02); *C09D 125/18* (2013.01); *C09D 133/10* (2013.01); *C09D 133/16* (2013.01); *G03F 7/0045* (2013.01); *G03F 7/039* (2013.01); *G03F 7/0397* (2013.01); *G03F 7/30* (2013.01); *G03F 7/38* (2013.01)

(58) Field of Classification Search
CPC ........ G03F 7/0392; G03F 7/0397; G03F 7/30; G03F 7/38
See application file for complete search history.

(56) References Cited

U.S. PATENT DOCUMENTS

| | | | | |
|---|---|---|---|---|
| 5,326,826 | A * | 7/1994 | Roeschert | G03F 7/039 526/309 |
| 6,319,648 | B1 * | 11/2001 | Reiser | G03F 7/039 430/905 |
| 6,475,706 | B1 | 11/2002 | Kishimura et al. | |
| 2002/0192593 | A1 | 12/2002 | Nagai et al. | |
| 2006/0078821 | A1 * | 4/2006 | Shimizu | G03F 7/0045 430/270.1 |
| 2017/0343898 | A1 | 11/2017 | Hatakeyama et al. | |
| 2018/0348632 | A1 | 12/2018 | Masuyama et al. | |

FOREIGN PATENT DOCUMENTS

| | | |
|---|---|---|
| CN | 102890418 A | 1/2013 |
| JP | 2000-267280 A | 9/2000 |
| JP | 2017-214480 A | 12/2017 |
| JP | 2018-95851 A | 6/2018 |

(Continued)

OTHER PUBLICATIONS

Office Action dated Jan. 17, 2023 in Taiwanese Application No. 108129885.
International Search Report issued Oct. 15, 2019 in International Application No. PCT/JP2019/031624.
Written Opinion of the International Searching Authority issued Oct. 15, 2019 in International Application No. PCT/JP2019/031624.
International Preliminary Report on Patentability issued Mar. 23, 2021 in International Application No. PCT/JP2019/031624.

(Continued)

*Primary Examiner* — John S Chu
(74) *Attorney, Agent, or Firm* — Sughrue Mion, PLLC

(57) ABSTRACT

The present invention provides an actinic ray-sensitive or radiation-sensitive resin composition which is excellent in LER performance and a collapse suppressing ability. Furthermore, the present invention provides a resist film, a pattern forming method, and a method for manufacturing an electronic device. The actinic ray-sensitive or radiation-sensitive resin composition of an embodiment of the present invention includes an acid-decomposable resin having a repeating unit represented by General Formula (1), and a compound that generates an acid upon irradiation with actinic rays or radiation.

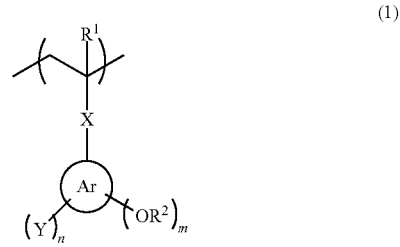

(1)

22 Claims, No Drawings

(56) References Cited

FOREIGN PATENT DOCUMENTS

| | | |
|---|---|---|
| JP | 2018-205710 A | 12/2018 |
| KR | 10-2017-0135764 A | 12/2017 |
| TW | I258058 B | 7/2006 |
| WO | 2017/029891 A1 | 2/2017 |

OTHER PUBLICATIONS

Office Action dated Apr. 6, 2023 from the Korean Intellectual Property Office in KR Application No. 10-2021-7008710.

* cited by examiner

ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

CROSS-REFERENCE TO RELATED APPLICATIONS

This application is a Continuation of PCT International Application No. PCT/JP2019/031624 filed on Aug. 9, 2019, which claims priority under 35 U.S.C. § 119(a) to Japanese Patent Application No. 2018-183900 filed on Sep. 28, 2018. The above application is hereby expressly incorporated by reference, in its entirety, into the present application.

BACKGROUND OF THE INVENTION

1. Field of the Invention

The present invention relates to an actinic ray-sensitive or radiation-sensitive resin composition, a resist film, a pattern forming method, and a method for manufacturing an electronic device.

2. Description of the Related Art

In processes for manufacturing semiconductor devices such as an integrated circuit (IC) and a large scale integrated circuit (LSI) in the related art, microfabrication by lithography using a photoresist composition (hereinafter also referred to as an "actinic ray-sensitive or radiation-sensitive resin composition") has been performed. In recent years, formation of an ultrafine pattern in a submicron region or a quarter-micron region has been demanded in accordance with realization of a high degree of integration for integrated circuits. With such a demand, a tendency that an exposure wavelength has been shifted from g-rays to i-rays, and further, as with KrF excimer laser light, the exposure wavelength is shortened is observed. Moreover, development of lithography with electron beams (EB), X-rays, or extreme ultraviolet rays (EUV), in addition to the excimer laser light, has also been currently in progress.

For example, in JP2018-095851A, a resin including a structural unit derived from a compound represented by Formula (I) and a structural unit having an acid-unstable group (claim 1) is disclosed. Furthermore, a resist composition containing the resin and an acid generator (claim 4) is also disclosed.

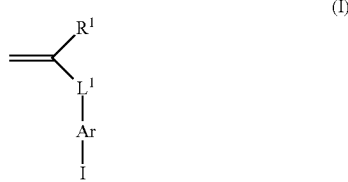

(I)

SUMMARY OF THE INVENTION

The present inventors have prepared an actinic ray-sensitive or radiation-sensitive resin composition with reference to the related art documents, have examined the composition, and have thus found that a pattern formed from the obtained actinic ray-sensitive or radiation-sensitive resin composition is deteriorated in a line edge roughness (LER) and a pattern collapse easily occurs in some cases at the time of forming a pattern. That is, the present inventors have clarified that it is necessary to further improve the LER of a pattern formed from an actinic ray-sensitive or radiation-sensitive resin composition and a pattern collapse suppressing ability at the time of forming a pattern using the actinic ray-sensitive or radiation-sensitive resin composition.

Hereinafter, the excellent LER of a pattern formed from an actinic ray-sensitive or radiation-sensitive resin composition is also simply referred to as excellent LER performance. In addition, an excellent pattern collapse suppressing ability at the time of forming a pattern using an actinic my-sensitive or radiation-sensitive resin composition is also simply referred to as an excellent collapse suppressing ability.

Therefore, an object of the present invention is to provide an actinic ray-sensitive or radiation-sensitive resin composition having excellent LER performance and an excellent collapse suppressing ability.

Furthermore, another object of the present invention is to provide a resist film, a pattern forming method, and a method for manufacturing an electronic device.

The present inventors have conducted intensive studies, and as a result, they have found that the objects can be accomplished by the following configurations.

[1] An actinic ray-sensitive or radiation-sensitive resin composition comprising:
  an acid-decomposable resin having a repeating unit represented by General Formula (1) which will be described later; and
  a compound that generates an acid upon irradiation with actinic rays or radiation.

[2] The actinic ray-sensitive or radiation-sensitive resin composition as described in [1].
  in which in General Formula (1) which will be described later, Y represents an organic group other than $OR^2$, which has a fluorine atom, or a fluorine atom.

[3] The actinic ray-sensitive or radiation-sensitive resin composition as described in [1] or [2],
  in which the repeating unit represented by General Formula (1) which will be described later is a repeating unit represented by General Formula (2) which will be described later.

[4] The actinic ray-sensitive or radiation-sensitive resin composition as described in [1],
  in which the repeating unit represented by General Formula (1) which will be described later is a repeating unit represented by General Formula (3) which will be described later.

[5] The actinic ray-sensitive or radiation-sensitive resin composition as described in any one of [1] to [4],
  in which the acid-decomposable resin further has a repeating unit having a fluorine atom, which is different from the repeating unit represented by General Formula (1) which will be described later.

[6] A resist film formed from the actinic ray-sensitive or radiation-sensitive resin composition as described in any one of [1] to [5].

[7] A pattern forming method comprising:
  a step of forming a resist film using the actinic ray-sensitive or radiation-sensitive resin composition as described in any one of [1] to [5];
  a step of exposing the resist film; and
  a step of developing the exposed resist film using a developer.

[8] A method for manufacturing an electronic device, comprising the pattern forming method as described in [7].

According to the present invention, it is possible to provide an actinic ray-sensitive or radiation-sensitive resin composition having excellent LER performance and an excellent collapse suppressing ability.

Furthermore, according to the present invention, it is possible to provide a resist film, a pattern forming method, and a method for manufacturing an electronic device.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

"Actinic rays" or "radiation" in the present specification means, for example, a bright line spectrum of a mercury lamp, far ultraviolet rays typified by an excimer laser, extreme ultraviolet rays (EUV), X-rays, electron beams (EB), or the like. "Light" in the present specification means actinic rays or radiation.

Unless otherwise specified, "exposure" in the present specification encompasses not only exposure by a bright line spectrum of a mercury lamp, far ultraviolet rays typified by an excimer laser, extreme ultraviolet rays, X-rays, EUV light, or the like, but also lithography by particle rays such as electron beams and ion beams.

In the present specification, a numerical range expressed using "to" is used in a meaning of a range that includes the preceding and succeeding numerical values of "to" as the lower limit value and the upper limit value, respectively.

The bonding direction of divalent groups described in the present specification is not limited unless otherwise specified. For example, in a case where Y is —COO— in a compound represented by General Formula "X—Y—Z", the compound may be either of "X—O—CO—Z" and "X—CO—O—Z".

In the present specification, (meth)acrylic acid represents acrylic acid and methacrylic acid.

In the present specification, the acid dissociation constant pKa (pKa) represents an acid dissociation constant pKa in an aqueous solution, and is defined, for example, in Chemical Handbook (II) (Revised 4th Edition, 1993, compiled by the Chemical Society of Japan, Maruzen Company, Ltd.). The lower the value of the acid dissociation constant pKa, the higher the acid strength. The value of the pKa is determined using the following software package 1 by computation from a value based on a Hammett substituent constant and the database of publicly known literature values. All of the values of pKa described in the present specification indicate values determined by computation using the software package.

Software Package 1: Advanced Chemistry Development (ACD/Labs) Software V 8.14 for Solaris (1994-2007 ACD/Labs).

With regard to citations for a group (atomic group) in the present specification, in a case where the group is cited without specifying whether it is substituted or unsubstituted, the group includes both a group having no substituent and a group having a substituent as long as the gist of the present invention is not impaired. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

Furthermore, in the present specification, in a case of referring to an expression "a substituent may be contained", the types of substituents, the positions of the substituents, and the number of the substituents are not particularly limited. The number of the substituents may be, for example, one, two, three, or more. Examples of the substituent include a monovalent non-metal atomic group from which a hydrogen atom has been excluded, and the substituent can be selected from the following substituent T group, for example.

(Substituent T)

Examples of the substituent T include halogen atoms such as a fluorine atom, a chlorine atom, a bromine atom, and an iodine atom; an alkoxy group such as a methoxy group, an ethoxy group, and a tert-butoxy group; an aryloxy group such as a phenoxy group and a p-tolyloxy group; an alkoxycarbonyl group such as a methoxycarbonyl group, a butoxycarbonyl group, and a phenoxycarbonyl group; an acyloxy group such as an acetoxy group, a propionyloxy group, and a benzoyloxy group; an acyl group such as an acetyl group, a benzoyl group, an isobutyryl group, an acryloyl group, a methacryloyl group, and a methoxalyl group; an alkylsulfanyl group such as a methylsulfanyl group and a tert-butylsulfanyl group; an arylsulfanyl group such as a phenylsulfanyl group and a p-tolylsulfanyl group; an alkyl group; a cycloalkyl group; an aryl group; a heteroaryl group; a hydroxyl group; a carboxyl group; a formyl group; a sulfo group; a cyano group; an alkylaminocarbonyl group; an arylaminocarbonyl group; a sulfonamido group; a silyl group; an amino group; a monoalkylamino group; a dialkylamino group; an arylamino group; and a combination thereof.

Furthermore, in the present specification, the weight-average molecular weight (Mw), the number-average molecular weight (Mn), and the dispersity (also referred to as a molecular weight distribution) (Mw/Mn) of a resin are each defined as a value converted in terms of polystyrene by means of gel permeation chromatography (GPC) measurement (solvent: tetrahydrofuran (THF), flow amount (amount of a sample injected): 10 µL, columns: TSK gel Multipore HXL-M manufactured by Tosoh Corporation, column temperature: 40° C., flow rate: 1.0 mL/min, detector: differential refractive index detector) using a GPC apparatus (HLC-8120 GPC manufactured by Tosoh Corporation).

[Actinic Ray-Sensitive or Radiation-Sensitive Resin Composition]

The actinic ray-sensitive or radiation-sensitive resin composition of an embodiment of the present invention (hereinafter also simply referred to as a "composition") includes an acid-decomposable resin having a repeating unit represented by General Formula (1) which will be described later, and a compound that generates an acid upon irradiation with actinic rays or radiation.

The mechanism by which the objects of the present invention am accomplished through such a configuration is not always clear, but is presumed to be as follows by the present inventors.

The repeating unit represented by General Formula (1) has a total of two or more of aromatic hydroxyl groups and groups in which the aromatic hydroxyl groups are protected by an acid-eliminable group. This configuration improves the solubility of the acid-decomposable resin having the repeating unit represented by General Formula (1) during development. On the other hand, since the repeating unit represented by General Formula (1) further has at least one of an organic group or a fluorine atom directly bonded to the aromatic ring group, the solubility of the acid-decomposable resin having the repeating unit represented by General Formula (1) is not excessive, and the dissolution rate is suppressed to an appropriate range. It is presumed that such the configuration improved the LER performance and the collapse suppressing ability of the composition. From the viewpoint that an effect of improving the LER performance and the collapse suppressing performance characteristic of the composition of the embodiment of the present invention is not observed, with the resin having one aromatic hydroxyl group (or a group in which an aromatic hydroxyl group is protected by an acid-eliminable group), it is presumed that incorporation of a total of two or more of aromatic hydroxyl groups (and groups in which an aromatic hydroxyl group is protected by an acid-eliminable group) is influenced by stronger interactions with a substrate and with a compound that generates an acid upon irradiation with actinic rays or radiation.

Hereinafter, the components included in the composition of the embodiment of the present invention will be described in detail. Furthermore, the composition of the embodiment of the present invention is a so-called resist composition, and may be either a positive tone resist composition or a negative tone resist composition. In addition, the composition of the embodiment of the present invention may be either a resist composition for alkali development or a resist composition for organic solvent development.

The composition of the embodiment of the present invention is typically a chemically amplified resist composition.
<Acid-Decomposable Resin (Resin (X))>

The composition of the embodiment of the present invention includes an acid-decomposable resin (hereinafter also referred to as a "resin (X)").

Incidentally, the resin (X) is typically a resin having a polarity that increases by an action of an acid as described above. More specifically, the resin (X) usually has a group having a polarity that increases through decomposition by an action of an acid (hereinafter also referred to as an "acid-decomposable group"), as described later. In this case, the acid-decomposable group of the resin (X) may have a repeating unit represented by General Formula (1), may have a repeating unit other than the repeating unit represented by General Formula (1), or may have both of the repeating unit represented by General Formula (1) and the repeating unit other than the repeating unit represented by General Formula (1).

Incidentally, the resin (X) is a resin having a polarity that increases by an action of an acid as described above. Therefore, in the pattern forming method of an embodiment of the present invention which will be described later, typically, in a case where an alkali developer is adopted as the developer, a positive tone pattern is suitably formed, and in a case where an organic developer is adopted as the developer, a negative tone pattern is suitably formed.

Hereinafter, the repeating unit represented by General Formula (1) included in the resin (X) and other repeating units which may be optionally included will be described in detail.
(Repeating Unit Represented by General Formula (1))
General Formula (1)

The repeating unit represented by General Formula (1) is shown below.

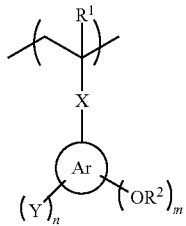

In General Formula (1), m represents an integer of 2 or more. m is preferably 2 to 5, and more preferably 2.

In General Formula (1), n represents an integer of 1 or more. n is preferably 1 to 5, more preferably 1 to 3, and still more preferably 1.

In General Formula (1), $R^1$ represents a hydrogen atom, a halogen atom (a fluorine atom, a chlorine atom, a bromine atom, an iodine atom, and the like), an alkyl group, a cycloalkyl group, a cyano group, or an alkoxycarbonyl group.

Among those, $R^1$ is preferably the hydrogen atom or the alkyl group.

The alkyl group may be linear or branched. The alkyl group preferably has 1 to 5 carbon atoms, and more preferably has one carbon atom.

In General Formula (1), X represents a single bond, —COO—, or —CONR$^3$—.

$R^3$ represents a hydrogen atom or an alkyl group (which may be linear or branched, and preferably has 1 to 5 carbon atoms).

Among those, X is preferably the single bond or —COO—. In addition, in —COO—, the carbonyl carbon in —COO— is preferably present on the main chain side of the resin.

In General Formula (1), Ar represents an aromatic ring group. The aromatic ring group may be either a monocycle or a polycycle. As the aromatic ring group, for example, an aromatic hydrocarbon ring group having 6 to 18 carbon atoms, such as a benzene ring group, a tolylene ring group, a naphthalene ring group, and an anthracene ring group, or an aromatic heterocyclic group including a heterocycle, such as a thiophene ring group, a furan ring group, a pyrrole ring group, a benzothiophene ring group, a benzofuran ring group, a benzopyrrole ring group, a triazine ring group, an imidazole ring group, a benzimidazole ring group, a triazole ring group, a thiadiazole ring group, and a thiazole ring group, is preferable.

Among those, Ar is preferably the aromatic hydrocarbon ring group, more preferably the benzene ring group or the naphthalene ring group, and still more preferably the benzene ring group.

In General Formula (1), $R^2$ represents a hydrogen atom or an acid-eliminable group.

In a case where $R^2$ is the acid-eliminable group, an aromatic hydroxyl group (preferably a phenolic hydroxyl group) as a polar group is protected by the acid-eliminable group to form an acid-decomposable group.

Examples of the acid-eliminable group include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently an alkyl group, a cycloalkyl group, an aryl group, an aralkyl group, or an alkenyl group. $R_{36}$ and $R_{37}$ may be bonded to each other to form a ring.

$R_{O1}$ and $R_{O2}$ each independently represent a hydrogen atom, an alkyl group, a cycloalkyl group, an aryl group, an aralkyl group, or an alkenyl group. It is also preferable that one of $R_{O1}$ and $R_{O2}$ is the hydrogen atom.

The alkyl group represented by each of $R_{36}$ to $R_{39}$, $R_{O1}$, and $R_{O2}$ may be linear or branched, and is preferably an alkyl group having 1 to 10 carbon atoms. Examples of the alkyl group include a methyl group, an ethyl group, a propyl group, an isopropyl group, an n-butyl group, a sec-butyl group, a tert-butyl group, a hexyl group, and an octyl group.

The cycloalkyl group represented by each of $R_{36}$ to $R_{39}$, $R_{O1}$, and $R_{O2}$ may be either a monocycle or a polycycle. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbomyl group, an isobornyl group, a camphanyl group, a dicyclopentyl group, an α-pinene group, a tricyclodecanyl group, a tetracyclododccyl group, and an androstanyl group. Further, at least one carbon atom in the cycloalkyl group may be substituted with a heteroatom such as an oxygen atom. Incidentally, one or more of the ethylene groups constituting the ring may be substituted with vinylene groups.

As the aryl group represented by each of $R_{36}$ to $R_{39}$, $R_{O1}$, and $R_{O2}$, an aryl group having 6 to 10 carbon atoms is preferable, and examples thereof include a phenyl group, a naphthyl group, and an anthryl group.

As the aralkyl group represented by each of $R_{36}$ to $R_{39}$, $R_{O1}$, and $R_{O2}$, an aralkyl group having 7 to 12 carbon atoms is preferable, and examples thereof include a benzyl group, a phenethyl group, and a naphthylmethyl group.

The alkenyl group represented by each of $R_{36}$ to $R_{39}$, $R_{O1}$, and $R_{O1}$ is preferably an alkenyl group having 2 to 8 carbon atoms, and examples thereof include a vinyl group, an allyl group, a butenyl group, and a cyclohexenyl group.

As the substituent contained in the alkyl group, the cycloalkyl group, the aryl group, the aralkyl group, or the alkenyl group represented by each of $R_{36}$ to $R_{39}$, $R_{O1}$, and $R_{O2}$, for example, a fluorine atom is preferable. For example, it is also preferable that the alkyl group is a fluoroalkyl group having a fluorine atom as a substituent.

As a ring formed by the mutual bonding of $R_{36}$ and $R_{37}$, a (monocyclic or polycyclic) cycloalkyl group is preferable. As the cycloalkyl group, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable. Incidentally, one or more of the ethylene groups constituting the ring may be substituted with vinylene groups.

Furthermore, in a case where a plurality of $R^2$'s as acid-eliminable groups are present in General Formula (1), the plurality of $R^2$'s as the acid-eliminable groups may be bonded to each other to form a ring.

In this case, for example, it is preferable that two $OR^2$'s are combined to form a group represented by General Formula (CA).

(CA)

In General Formula (CA), $R^{ca1}$ and $R^{ca2}$ each independently represent an alkyl group (which may be linear or branched, and has preferably 1 to 8 carbon atoms), a cycloalkyl group (preferably having 3 to 15 carbon atoms), an aralkyl group (preferably having 7 to 14 carbon atoms), or an aryl group (preferably having 6 to 14 carbon atoms), the alkyl group is preferable, and the methyl group is more preferable.

$R^{ca1}$ and $R^{ca2}$ may be bonded to each other to form a ring.

* represents a bonding position to Ar in General Formula (1).

In a case where two $OR^2$'s are present in General Formula (1), it is preferable that an atom in Ar to which one of $OR^2$'s is bonded and an atom in Ar to which the other of OR's is bonded are adjacent to each other, or the atoms are in a positional relationship such that another atom is sandwiched between the atoms.

In other words, it is preferable that the two $OR^2$'s are arranged in the ortho position or meta position to each other in Ar (preferably a benzene ring group). Among these, it is more preferable that the two $OR^2$'s are preferably arranged in the meta position to each other in Ar (preferably a benzene ring group).

A reason why it is preferable to be arranged in the meta position is presumed as follows. That is, in a case where the $OR^2$ groups are arranged in the meta position with each other, the interaction between the $OR^2$ groups and a substituent adjacent thereto is weak, and thus, the $OR^2$ groups can form a strong interaction with a substrate and/or a compound that generates an acid upon irradiation with actinic ray or radiation. On the other hand, it is presumed that in a case where the $OR^2$ groups are adjacent to each other, an interaction between the adjacent $OR^2$ groups is strong, and thus. an interaction formed by the $OR^2$ groups with a substrate and/or a compound that generates an acid upon irradiation with actinic ray or radiation is relatively lower, as compared with a case where the $OR^2$ groups are arranged in the meta position with each other.

In General Formula (1), Y represents an organic group other than $OR^2$, or a fluorine atom.

The organic group other than $OR^2$ in Y is not limited unless it is a group represented by "—O-acid-eliminable group", and may form an acid-decomposable group other than the "—O-acid-eliminable group".

Examples of the organic group other than $OR^2$ in Y include an alkyl group, a cycloalkyl group, an aryl group, an aralkyl group, and an alkenyl group, and the alkyl group or the cycloalkyl group is preferable.

The alkyl group, the cycloalkyl group, the aryl group, the aralkyl group, and the alkenyl group are the same as those described in the explanations of $R_{36}$ to $R_{39}$, $R_{O1}$, and $R_{O2}$ as mentioned above, respectively.

Among those, Y preferably represents an organic group other than $OR^2$, which has a fluorine atom, or a fluorine atom. In a case where Y represents the organic group other than $OR^2$, which has a fluorine atom, or the fluorine atom, it can be suitably used, in particular, in lithography with EUV. It is considered that since the fluorine atom absorbs a large amount of EUV, it contributes to high sensitivity and improvement of LER performance. An iodine atom is also well known as a halogen atom which absorbs a large amount of EUV, but it was found to have an unexpectedly reduced effect on improvement of LER performance in the experiments of the present application. It is presumed that since a C—I bond is much weaker than a C—F bond, the C—I bond is ruptured upon irradiation with high-energy EUV light, and thus, a desired effect could not be obtained.

Examples of the organic group other than $OR^2$, which has a fluorine atom, include the above-mentioned alkyl group, cycloalkyl group, aryl group, aralkyl group, and alkenyl group, each of which has a fluorine atom as a substituent.

Among those, the organic group other than $OR^2$, which has a fluorine atom, is preferably in the form of a fluoroalkyl group in which the alkyl group has a fluorine atom as a substituent.

The fluoroalkyl group may be a perfluoroalkyl group or a group other than the perfluoroalkyl group, and may or may not have a substituent other than a fluorine atom.

Further, the fluoroalkyl group may be linear or branched, and preferably has 1 to 10 carbon atoms, and more preferably has 2 to 8 carbon atoms.

The number of fluorine atoms contained in the organic group (preferably a fluoroalkyl group) other than $OR^2$, which has a fluorine atom, is preferably 1 to 30, and more preferably 4 to 20.

In General Formula (1), $R^2$'s present in plurality may be the same as or different from each other.

In a case where n is 2 or more, Y's present in plurality may be the same as or different from each other.

It is preferable that the repeating unit represented by General Formula (1) has a fluorine atom from the viewpoint of better LER performance. There is no limitation on the form in which the repeating unit represented by General Formula (1) has a fluorine atom, and for example, it is preferable that any one or more of $R^1$, $R^2$, and Y have fluorine atoms, and it is more preferable that at least one Y has a fluorine atom (that is, at least one Y is an organic group other than $OR^2$, which has a fluorine atom, or a fluorine atom).

General Formula (1a)

The repeating unit represented by General Formula (1) is preferably a repeating unit represented by General Formula (1a) from the viewpoint that it has a more excellent collapse suppressing ability.

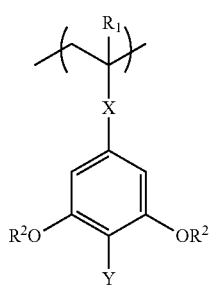

(1a)

In General Formula (1a), $R^1$ represents a hydrogen atom, a halogen atom, an alkyl group, a cycloalkyl group, a cyano group, or an alkoxycarbonyl group.

$R^1$ in General Formula (in) is the same as $R^1$ in General Formula (1).

In General Formula (1a), X represents a single bond, —COO—, or —$CONR^3$—.

$R^1$ represents a hydrogen atom or an alkyl group.

X and $R^3$ in General Formula (1a) are the same as X and $R^3$ in General Formula (1), respectively.

In General Formula (1a), $R^2$ represents a hydrogen atom or an acid-eliminable group.

$R^2$ in General Formula (1a) is the same as $R^2$ in General Formula (1).

Incidentally, $R^2$'s present in plurality may be the same as or different from each other.

In General Formula (1a), Y represents an organic group other than $OR^2$, or a fluorine atom.

Y in General Formula (1a) is the same as Y in General Formula (1).

General Formula (2)

The repeating unit represented by General Formula (1) is preferably a repeating unit represented by General Formula (2) from the viewpoint that it has a more excellent collapse suppressing ability.

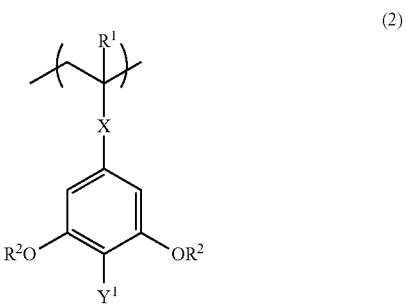

(2)

In General Formula (2), $R^1$ represents a hydrogen atom, a halogen atom, an alkyl group, a cycloalkyl group, a cyano group, or an alkoxycarbonyl group.

$R^1$ in General Formula (2) is the same as $R^1$ in General Formula (1).

In general Formula (2), X represents a single bond, —COO—, or —$CONR^3$—.

$R^3$ represents a hydrogen atom or an alkyl group.

X and $R^3$ in General Formula (2) are the same as X and $R^3$ in General Formula (1), respectively.

In General Formula (2), $R^2$ represents a hydrogen atom or an acid-eliminable group.

$R^2$ in General Formula (2) is the same as $R^2$ in General Formula (1).

Incidentally, $R^2$'s present in plurality may be the same as or different from each other.

In General Formula (2), $Y^1$ represents an organic group other than $OR^2$, which has a fluorine atom, or a fluorine atom.

The organic group other than $OR^2$, which has a fluorine atom, is the same as the organic group other than $OR^2$, which has a fluorine atom, described in the description of General Formula (1).

General Formula (3)

In the repeating unit represented by General Formula (1), in a case where Y is neither an organic group other than $OR^2$, which has a fluorine atom, nor a fluorine atom, it is preferable that the repeating unit represented by General Formula (1) is a repeating unit represented by General Formula (3) from the viewpoint that it has a more excellent collapse suppressing ability.

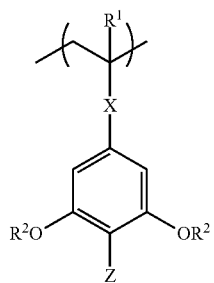

(3)

In General Formula (3), $R^1$ represents a hydrogen atom, a halogen atom, an alkyl group, a cycloalkyl group, a cyano group, or an alkoxycarbonyl group.

$R^1$ in General Formula (3) is the same as $R^1$ in General Formula (1).

In General Formula (3), X represents a single bond, —COO—, or —$CONR^3$—.

$R^3$ represents a hydrogen atom or an alkyl group.

X and $R^3$ in General Formula (3) are the same as X and $R^3$ in General Formula (1), respectively.

In General Formula (3), $R^2$ represents a hydrogen atom or an acid-eliminable group.

$R^2$ in General Formula (3) is the same as $R^2$ in General Formula (1).

Incidentally, $R^2$'s present in plurality may be the same as or different from each other.

In General Formula (3), Z represents an organic group other than $OR^2$, which includes no fluorine atom.

Examples of the organic group include an alkyl group, a cycloalkyl group, an aryl group, an aralkyl group, and an alkenyl group, and the alkyl group or the cycloalkyl group is preferable.

The alkyl group, the cycloalkyl group, the aryl group, the aralkyl group, and the alkenyl group are the same as those described in the explanations of $R_{36}$ to $R_{39}$, $R_{01}$, and $R_{02}$ as mentioned above, respectively. It should be noted that these groups in Z have no fluorine atom. Incidentally, these groups may have a substituent as long as it is neither a fluorine atom nor a group including a fluorine atom in a part thereof.

The content of the repeating unit represented by General Formula (1) is preferably 10% to 100% by mass, and more preferably 10% to 80% by mass with respect to all the repeating units of the resin (X).

Among those, in a case where the repeating unit represented by General Formula (1) has no acid-decomposable group (a case where any of $R^2$'s are hydrogen atoms), the content of the repeating unit represented by General Formula (1), having no acid-decomposable group, is preferably 15% to 70% by mass with respect to all the repeating units of the resin (X).

In a case where the repeating unit represented by General Formula (1) has an acid-decomposable group (a case where one or more $R^2$'s are acid-eliminable groups), the content of the repeating unit represented by General Formula (1), having no acid-decomposable group, is preferably 20% to 80% by mass with respect to all the repeating units of the resin (X).

The resin (X) may further have other repeating units, in addition to the repeating unit represented by General Formula (1).

Such other repeating units which may be contained in the resin (X) are described in detail below.

(Other Repeating Units Having Acid-Decomposable Group)

The resin (X) may have other repeating units having an acid-decomposable group. Such other repeating units having an acid-decomposable group as mentioned herein are intended to mean repeating units which are different from the repeating unit represented by General Formula (1).

The acid-decomposable group in such other repeating units having an acid-decomposable group is not limited, and is preferably a group having a structure in which a polar group is protected by an acid-eliminable group that is eliminated by an action of an acid.

Examples of the polar group include an acidic group (a group which dissociates in a 2.38%-by-mass aqueous tetramethylammonium hydroxide solution), such as an aromatic hydroxyl group such as a carboxyl group and a phenolic hydroxyl group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and an alcoholic hydroxyl group.

Moreover, the alcoholic hydroxyl group refers to a hydroxyl group bonded to a hydrocarbon group, which is a hydroxyl group (a phenolic hydroxyl group and the like) other than a hydroxyl group directly bonded to an aromatic ring, from which an aliphatic alcohol group (for example, a hexafluoroisopropanol group) having the α-position substituted with an electron withdrawing group such as a fluorine atom is excluded as a hydroxyl group. The alcoholic hydroxyl group is preferably a hydroxyl group having an acid dissociation constant (pKa) from 12 to 20.

Among the polar groups, the carboxyl group, the aromatic hydroxyl group (the phenolic hydroxyl group and the like), or the hexafluoroisopropanol group is preferable.

Examples of the acid-eliminable group include the same ones as —$C(R_{36})(R_{37})(R_{38})$, —$C(R_{36}))(R_{37})(OR_{39})$, and —$C(R_{01})(R_{02})(OR_{39})$ as mentioned above.

General Formula (AI)

As such another repeating unit having an acid-decomposable group, a repeating unit represented by General Formula (AI) is preferable.

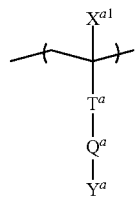

(AI)

In General Formula (AI), $X^{a1}$ represents a hydrogen atom, a halogen atom, or an alkyl group.

As the halogen atom represented by $X^{a1}$, a fluorine atom or an iodine atom is preferable.

The alkyl group represented by $X^{a1}$ may be linear or branched, and preferably has 1 to 6 carbon atoms. In a case where the alkyl group has a substituent, the substituent is preferably a fluorine atom.

As $X^{a1}$, a hydrogen atom, a fluorine atom, an iodine atom, a methyl group, a trifluoromethyl group, or a hydroxymethyl group is preferable.

In General Formula (AI), $T^a$ represents a single bond or a divalent linking group.

Examples of the divalent linking group represented by T include an alkylene group, an arylene group, a —COO—Rt— group, and an —O—Rt— group. In the formulae, Rt represents an alkylene group or a cycloalkylene group.

T is preferably the single bond or the —COO—Rt— group. In a case where T represents the —COO—Rt— group, Rt is preferably an alkylene group having 1 to 5 carbon atoms.

In General Formula (AI), $Q^a$ represents —COO— or -aromatic ring group-O—.

—COO— preferably has a carbonyl group moiety which is bonded to $T^a$.

The -aromatic ring group-O— preferably has an aromatic ring group moiety which is bonded to $T^a$.

That is, in a case where $Q^a$ is —COO—, it is preferable that $-T^a-Q^a-Y^a$ in General Formula (AI) is $-T^a$-CO—$OY^a$. In a case where $Q^a$ is -aromatic ring group-O—, it is preferable that $-T^a-Q^a-Y^a$ in General Formula (AI) is a $-T^a$-aromatic ring group-$OY^a$.

Examples of the aromatic ring group in the -aromatic ring group-O— include the same ones as the groups mentioned in the description of Ar in General Formula (1).

The aromatic ring group in the -aromatic ring group —O— may or may not have a substituent other than —$OY^a$. It should be noted that types and combinations of the substituents which may be contained in the aromatic ring group in the -aromatic ring group-O— are other than the types and the combinations of the substituents in a case where the repeating unit represented by General Formula (AI) is the repeating unit included in the repeating unit represented by General Formula (1).

In General Formula (AI), $Y^a$ represents an acid-eliminable group. Examples of the acid-eliminable group include —C($R_{36}$)($R_{37}$)($R_{38}$), —C($R_{36}$)($R_{37}$)(O$R_{38}$), and —C($R_{01}$)($R_{02}$)(O$R_{39}$) as mentioned above.

Such other repeating units having an acid-decomposable group may be used singly or in combination of two or more kinds thereof.

In a case where the resin (X) has such other repeating units having an acid-decomposable group, the content of such other repeating units having an acid-decomposable group is preferably 5% to 80% by mass, more preferably 5% to 75% by mass, and still more preferably 10% to 70% by mass with respect to all the repeating units in the resin (X).

In addition, the total content of the acid-decomposable repeating units (the total content of the repeating unit represented by General Formula (1), which has an acid-decomposable group, and other repeating units having an acid-decomposable group) of the resin (X) as a whole is preferably 10% to 80% by mass, and more preferably 30% to 80% by mass.

(Repeating Unit Having Lactone Structure)

The resin (X) may have a repeating unit having a lactone structure in addition to the above-mentioned repeating units.

As the lactone structure, a 5- to 7-membered ring lactone structure is preferable, and a 5- to 7-membered ring lactone structure to which another ring structure is fused so as to form a bicyclo structure or a spiro ring structure is more preferable. A lactone structure represented by any of General Formulae (LC1-1) to (LC1-22) in a repeating unit having a lactone structure is preferable.

As the lactone structure, a lactone structure represented by General Formula (LC1-1), General Formula (LC1-4), General Formula (LC1-5), General Formula (LC1-6), General Formula (LC1-13), General Formula (LC1-14), or General Formula (LC1-22) is preferable.

The lactone structure is derived into a group including the lactone structure by removing any one or more of hydrogen atoms therefrom.

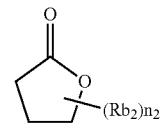

LC1-1

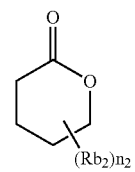

LC1-2

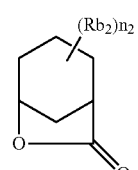

LC1-3

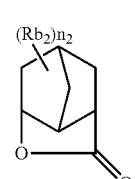

LC1-4

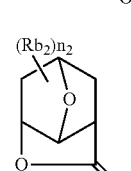

LC1-5

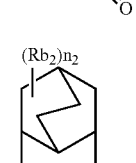

LC1-6

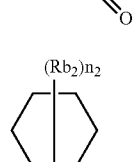

LC1-7

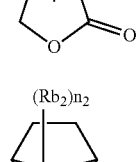

LC1-8

LC1-9

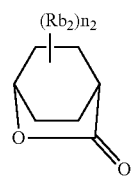

LC1-10

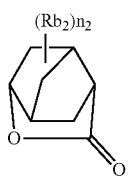

LC1-11

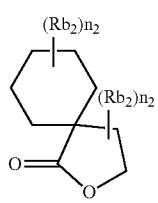

LC1-12

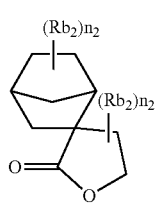

LC1-13

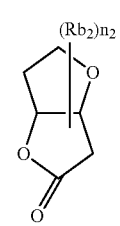

LC1-14

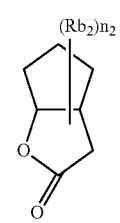

LC1-15

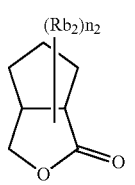

LC1-16

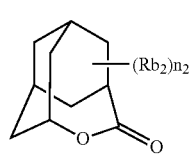

LC1-17

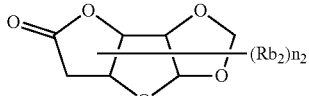

LC1-18

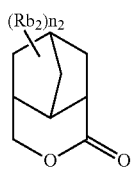

LC1-19

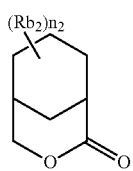

LC1-20

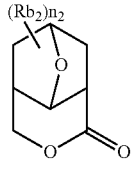

LC1-21

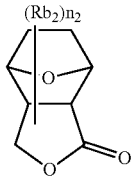

LC1-22

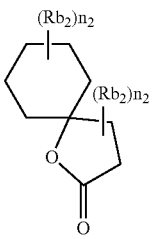

The lactone structure may have a substituent ($Rb_2$). As the substituent ($Rb_2$), an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, a group having a hexafluoroisopropanol group, and an aromatic ring group (an aromatic hydrocarbon ring group having 6 to 12 carbon atoms, and the like) are preferable. $n_2$ represents an integer of 0 to 4. In a case where $n_2$ is 2 or more, $Rb_2$'s are present in plurality may be different from each other, and $Rb_2$'s present in plurality may be bonded to each other to form a ring.

In a case where it is possible for these substituents to have a substituent, it is preferable that the substituents each have a substituent (a fluorine atom or the like). For example, it is also preferable that the alkyl group is a fluoroalkyl group having a fluorine atom as the substituent.

General Formula (AI)

Examples of the repeating unit having a lactone structure include a repeating unit represented by General Formula (AI).

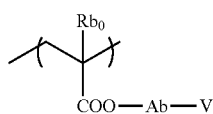

(AI)

In General Formula (AI), $Rb_0$ represents a hydrogen atom or an alkyl group having 1 to 4 carbon atoms.

As the substituent which may be contained in the alkyl group of $Rb_0$, a hydroxyl group is preferable.

$Rb_0$ is preferably the hydrogen atom or a methyl group.

Ab represents a single bond, an alkylene group, a divalent linking group having a monocyclic or polycyclic alicyclic hydrocarbon group, an ether group, an ester group, a carbonyl group, a carboxyl group. or a divalent group formed by combination thereof. Among these, the single bond or a linking group represented by $-Ab_1-COO-$ is preferable. $Ab_1$ is a linear or branched alkylene group, or a monocyclic or polycyclic cycloalkylene group, and preferably a methylene group, an ethylene group, a cyclohexylene group, an adamantylene group, or a norbornylene group.

V represents a group formed by removing one of any hydrogen atoms from a lactone structure represented by any of General Formulae (LC1-1) to (LC1-22).

Moreover, the lactone structure may be directly bonded to the main chain. Examples of the repeating unit having a lactone structure in this case include a repeating unit in which two hydrogen atoms are removed from any methylene group in a lactone structure represented by any of General Formulae (LC1-1) to (LC1-22), and a ring member atom having a lactone structure is an atom constituting the main chain at the same time.

The repeating unit having a lactone structure may be used singly or in combination of two or more kinds thereof.

In a case where the resin (X) has a repeating unit having a lactone structure, the content of the repeating unit having a lactone structure is preferably 5% to 60% by mass, and more preferably 10% to 50% ala by mass with respect to all the repeating units in the resin (X).

(Repeating Unit Having Aromatic Hydroxyl Group)

The resin (X) may have another repeating unit, in addition to the above-mentioned repeating units. Examples of such another repeating unit include a repeating unit other than the above-mentioned repeating units, which has an aromatic hydroxyl group (preferably a repeating unit having a phenolic hydroxyl group such as a repeating unit based on hydroxystyrene).

The repeating unit having an aromatic hydroxyl group may be used singly or in combination of two or more kinds thereof.

In a case where the resin (X) has the repeating unit having an aromatic hydroxyl group, the content of the repeating unit having an aromatic hydroxyl group is preferably 5% to 50% by mass, and more preferably 5% to 40% by mass with respect to all the repeating units in the resin (X).

(Repeating Unit with Fluorine Atom)

It is preferable that the resin (X) is a repeating unit having a fluorine atom (also simply referred to as a "repeating unit having a fluorine atom"), which is different from the repeating unit represented by General Formula (1), from the viewpoint that the resin (X) is more excellent in LER performance and/or a sensitivity. Above all, in a case where the resin (X) has no repeating unit represented by General Formula (1), which has a fluorine atom, it is preferable that the resin (X) has a repeating unit having a fluorine atom.

A form in which a fluorine atom is present in the repeating unit having the fluorine atom is not particularly limited, and the fluorine atom may be included in, for example, a fluoroalkyl group (a trifluoromethyl group, a trifluoroethyl group, a hexafluoroisopropyl group, and the like), a fluorinated alcohol group (a hexafluoroisopropanol group and the like), or the like.

The repeating unit having a fluorine atom may be the above-mentioned other repeating unit having an acid-decomposable group, which has a fluorine atom, may be the above-mentioned repeating unit having a lactone structure, which has a fluorine atom, may be the above-mentioned repeating unit having an aromatic hydroxyl group, which has a fluorine atom, or may be another repeating unit other than the above-mentioned repeating units, which has a fluorine atom.

Examples of such another repeating unit other than the above-mentioned repeating units, which has a fluorine atom, include hexafluoroisopropyl (meth)acrylate and bis(hexafluoro-2-hydroxypropan-2-yl)cyclohexyl (meth)acrylate.

The repeating unit having a fluorine atom (repeating unit having a fluorine atom other than the repeating unit represented by General Formula (1)) may be used singly or in combination of two or more kinds thereof.

The content of the repeating unit having a fluorine atom (the total content of the repeating unit having a fluorine atom other than the repeating unit represented by General Formula (1)) is preferably 5% to 60% by mass, and more preferably 10% to 50% by mass with respect to all the repeating units in the resin (X).

The resin (X) can be synthesized in accordance with an ordinary method (for example, radical polymerization).

The weight-average molecular weight of the resin (X) is preferably 3,500 to 30,000, more preferably 3,500 to 25,000, and still more preferably 4,000 to 12,000. The dispersity (Mw/Mn) is usually 1.0 to 3.0, preferably 1.0 to 2.6, more preferably 1.0 to 2.0, and still more preferably 1.1 to 2.0.

The resin (X) may be used singly or in combination of two or more kinds thereof.

The content of the resin (X) in the composition of the embodiment of the present invention (in a case where the resins (X) are present in plurality, a total content thereof) is generally preferably 20.0% by mass or more, more preferably 40.0% by mass or more, still more preferably 50.0% by mass or more, and particularly preferably 60.0% by mass or more with respect to the total solid content of the composition. An upper limit thereof is not particularly limited, but is preferably 99.9% by mass or less, more preferably 99.5% by mass or less, still more preferably 99.0% by mass or less, and particularly preferably 90.0% by mass or less.

<Compound that Generates Acid Upon Irradiation with Actinic Rays or Radiation>

The composition of the embodiment of the present invention includes a compound that generates an acid upon irradiation with actinic rays or radiation (hereinafter also referred to as a "photoacid generator").

The photoacid generator may be in a form of a low-molecular-weight compound or a form incorporated into a part of a polymer. Further, a combination of the form of a low-molecular-weight compound and the form incorporated into a part of a polymer may also be used.

In a case where the photoacid generator is in the form of a low-molecular-weight compound, the molecular weight is preferably 3,000 or less, more preferably 2,000 or less, and still more preferably 1,000 or less.

In a case where the photoacid generator is incorporated into a part of a polymer, it may be incorporated into a part of the resin (X) or in a resin different from the resin (X).

Among those, the photoacid generator is preferably in the form of a low-molecular-weight compound.

The photoacid generator is not particularly limited as long as it is a known one, but is preferably a compound that generates an organic acid upon irradiation with actinic rays or radiation (preferably EUV or EB).

As the organic acid, for example, at least any one of sulfonic acid, bis(alkylsulfonyl)imide, or tris(alkylsulfonyl)methide is preferable.

The photoacid generator is preferably a compound represented by General Formula (ZI), General Formula (ZII), or General Formula (ZIII).

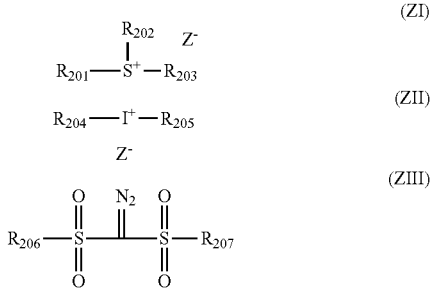

In General Formula (ZI), $R_{201}$, $R_{202}$, and $R_{203}$ each independently represent an organic group.

The organic group represented by each of $R_{201}$, $R_{202}$, and $R_{203}$ generally has 1 to 30 carbon atoms, and preferably has 1 to 20 carbon atoms.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{210}$ to $R_{203}$ include an alkylene group (for example, a butylene group and a pentylene group).

$Z^-$ represents a non-nucleophilic anion (anion having an extremely low ability to cause a nucleophilic reaction).

Examples of the organic group of each of $R_{201}$, $R_{202}$, and $R_{203}$ include an aryl group, an alkyl group, and a cycloalkyl group.

It is preferable that at least one of $R_{201}$, $R_{202}$, or $R_{203}$ is an aryl group, and it is more preferable that all of $R_{201}$, $R_{202}$, and $R_{203}$ represent an aryl group. As the aryl group, not only a phenyl group, a naphthyl group, or the like but also a heteroaryl group such as an indole residue and a pyrrole residue is also available.

As the alkyl group of each of $R_{201}$ to $R_{203}$, a linear or branched alkyl group having 1 to 10 carbon atoms is preferable, and a methyl group, an ethyl group, an n-propyl group, an i-propyl group, or an n-butyl group is more preferable.

As the cycloalkyl group of each of $R_{201}$ to $R_{203}$, a cycloalkyl group having 3 to 10 carbon atoms is preferable, and a cyclopropyl group, a cyclobutyl group, a cyclopentyl group, a cyclohexyl group, or a cycloheptyl group is more preferable.

Examples of the non-nucleophilic anion include a sulfonate anion (an aliphatic sulfonate anion, an aromatic sulfonate anion, a camphor sulfonate anion, and the like), a carboxylate anion (an aliphatic carboxylate anion, an aromatic carboxylate anion, an aralkyl carboxylate anion, and the like), a sulfonylimide anion, a bis(alkylsulfonyl)imide anion, and a tris(alkylsulfinyl)methide anion.

The aliphatic moiety in each of the aliphatic sulfonate anion and the aliphatic carboxylate anion may be an alkyl group or a cycloalkyl group, and has a linear or branched alkyl group having 1 to 30 carbon atoms, or is preferably a cycloalkyl group having 3 to 30 carbon atoms.

The aryl group in the aromatic sulfonate anion and the aromatic carboxylate anion is preferably an aryl group having 6 to 14 carbon atoms, and examples thereof include a phenyl group, a tolyl group, and a naphthyl group.

The alkyl group, the cycloalkyl group, and the aryl group exemplified above may have a substituent.

The aralkyl group in the aralkylcarboxylate anion is preferably an aralkyl group having 7 to 14 carbon atoms, and examples thereof include a benzyl group, a phenethyl group, a naphthylmethyl group, a naphthylethyl group, and a naphthylbutyl group.

Examples of the sulfonylimide anion include a saccharin anion.

The alkyl group in the bis(alkylsulfonyl)imide anion and the tris(alkylsulfonyl)methide anion is preferably an alkyl group having 1 to 5 carbon atoms.

Furthermore, the alkyl group in the bis(alkylsulfonyl)imide anion may be bonded to each other to form a ring structure. As a result, the acid strength increases.

Examples of the other non-nucleophilic anions include fluorinated phosphorus (for example, $PF_6^-$), fluorinated boron (for example, $BF_4^-$), and fluorinated antimony (for example, $SbF_6^-$).

As the non-nucleophilic anion, an aliphatic sulfonate anion in which at least α-position of sulfonic acid is substituted with a fluorine atom, an aromatic sulfonate anion substituted with a fluorine atom or a group having a fluorine atom, a bis(alkylsulfonyl)imide anion in which an alkyl group is substituted with a fluorine atom, or a tris(alkylsulfonyl)methide anion in which an alkyl group is substituted with a fluorine atom is preferable. Among those, a perfluoroaliphatic sulfonate anion (preferably having 4 to 8 carbon atoms) or a benzene sulfonate anion having a fluorine atom is more preferable, and a nonafluorobutane sulfonate anion, a perfluorooctane sulfonate anion, a pentafluorobenzene sulfonate anion, or a 3,5-bis(trifluoromethyl) benzenesulfonate anion is more preferable.

The pKa of an acid generated is preferably −1 or less from the viewpoint that the obtained resist film has an excellent sensitivity.

Furthermore, as the non-nucleophilic anion, an anion represented by General Formula (AN1) is also preferable.

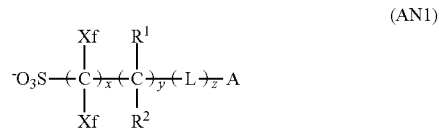

In the formula,

Xf's each independently represent a fluorine atom or an alkyl group substituted with at least one fluorine atom.

$R^1$ and $R^2$ each independently represent a hydrogen atom, a fluorine atom, or an alkyl group, and in a case where $R^1$'s and $R^2$'s are each present in plurality, $R^1$'s and $R^2$'s may each be the same as or different from each other.

L represents a divalent linking group, and in a case where L's are present in plurality, L's may be the same as or different from each other.

A represents a cyclic organic group.

x represents an integer of 1 to 20, y represents an integer of 0 to 10, and z represents an integer of 0 to 10.

In General Formula (ZII) and General Formula (ZIII), $R_{204}$ to $R_{207}$ each independently represent an aryl group, an alkyl group, or a cycloalkyl group.

As the aryl group, the alkyl group, and the cycloalkyl group of each of $R_{204}$ to $R_{207}$ have the same definitions as the aryl group, the alkyl group, and the cycloalkyl group, respectively, of each of $R_{201}$ to $R_{203}$ in General Formula (ZI) as described above.

$Z^-$ represents a non-nucleophilic anion, has the same definition as the non-nucleophilic anion of $Z^-$ in General Formula (ZI), and a suitable aspect thereof is also the same.

With regard to the photoacid generator, reference can be made to paragraphs [0368] to [0377] of JP2014-041328A and paragraphs [0240] to [0262] of JP2013-228681A (corresponding to paragraph [0339] of the specification of US2015/0004533A), the contents of which are incorporated herein by reference.

The photoacid generators may be used singly or in combination of two or more kinds thereof.

The content of the photoacid generator (in a case where the photoacid generators are present in plurality, a total content thereof) in the composition of the embodiment of the present invention is preferably 0.1% to 50.0% by mass, more preferably 1.0% to 40.0% by mass, and still more preferably 5.0% W to 40.0% by mass with respect to a total solid content of the composition.

<Acid Diffusion Control Agent>

The composition of the embodiment of the present invention may include an acid diffusion control agent. The acid diffusion control agent acts as a quencher that suppresses a reaction of the acid-decomposable resin in the unexposed area by excessive generated acids by trapping the acids generated from a photoacid generator and the like upon exposure. For example, a basic compound (DA), a compound (DB) having basicity that is reduced or lost upon irradiation with actinic rays or radiation, or the like can be used as the acid diffusion control agent.

As the basic compound (DA), compounds having structures represented by Formulae (A) to (E) are preferable.

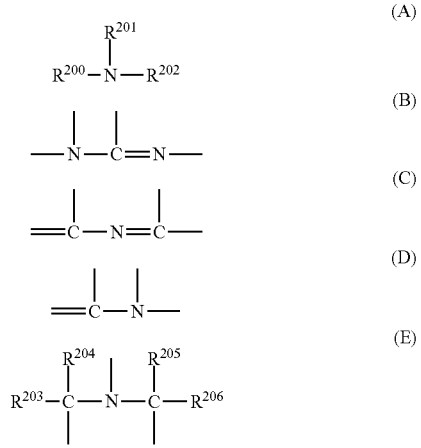

In General Formulae (A) and (F), $R^{200}$, $R^{201}$, and $R^{202}$ each independently represent a hydrogen atom, an alkyl group (preferably having 1 to 20 carbon atoms), a cycloalkyl group (preferably having 3 to 20 carbon atoms), or an aryl group (preferably having 6 to 20 carbon atoms). $R^{201}$ and $R^{202}$ may be bonded to each other to form a ring.

In General Formula (E), $R^{203}$, $R^{204}$, $R^{205}$, and $R^{206}$ each independently represent an alkyl group having 1 to 20 carbon atoms.

The alkyl group in each of General Formulae (A) and (E) may have a substituent or may be unsubstituted.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl group in each of General Formulae (A) and (E) is more preferably unsubstituted.

As the basic compound (DA), guanidine, aminopyrrolidine, pyrazole, pyrazoline, piperazine, aminomorpholine, aminoalkylmorpholine, piperidine, or the like is preferable; and a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond, or the like is more preferable.

Moreover, a superorganic base can also be used as the basic compound (DA). Examples of the superorganic base include guanidine bases such as tetramethylguanidine and polyguanidine (including guanidine and guanidine derivatives such as substituted forms thereof and polyguanides), amidine-based and guanidine-based polynitrogen polyheterocyclic compounds and polymer-carrying strong bases thereof, typified by diazabicyclononene (DBN), diazabicycloundecene (DBU), triazabicyclodecene (TBD), N-methyltriazabicyclodecene (MTBD), and the like, phosphazene-based (Schweisinger) bases, and proazaphosphatran (Verkade) bases.

Moreover, as the basic compound (DA), an amine compound and an ammonium salt compound can also be used. Examples of the amine compound include primary, secondary, and tertiary amine compounds, and the amine compound is preferably an amine compound in which at least one or more alkyl groups (preferably having 1 to 20 carbon atoms) are bonded to nitrogen atoms, and among these, the tertiary amine compound is more preferable.

Furthermore, in a case where the amine compound is the secondary or tertiary amine compound, examples of a group bonded to the nitrogen atom in the amine compound include, in addition to the above-described alkyl groups, a cycloalkyl group (preferably having 3 to 20 carbon atoms) and an aryl group (preferably having 6 to 12 carbon atoms).

Examples of the ammonium salt compound include primary, secondary, tertiary, and quaternary ammonium salt compounds, and an ammonium salt compound in which one or more alkyl groups are bonded to a nitrogen atom is preferably.

Furthermore, in a case where the ammonium salt compound is a secondary, tertiary, or quaternary ammonium salt compound, examples of a group which is bonded to a nitrogen atom in the ammonium salt compound include, in addition to the above-described alkyl groups, a cycloalkyl group (preferably having 3 to 20 carbon atoms) and an aryl group (preferably having 6 to 12 carbon atoms).

Examples of the anion of the ammonium salt compound include a halogen atom, a sulfonate, a borate, and a phosphate, and among these, the halogen atom or the sulfonate is preferable.

As the halogen atom, a chlorine atom, a bromine atom, or an iodine atom is preferable.

As the sulfonate, an organic sulfonate having 1 to 20 carbon atoms is preferable, and preferred specific examples thereof include alkyl sulfonate and aryl sulfonate, having 1 to 20 carbon atoms.

Moreover, as the basic compound (DA), an amine compound having a phenoxy group and an ammonium salt compound having a phenoxy group can also be used.

The amine compound having a phenoxy group and the ammonium salt compound having a phenoxy group are each a compound having a phenoxy group at the terminal on the opposite side to the nitrogen atom of the alkyl group which is contained in the amine compound or the ammonium salt compound.

The compound (DB) having basicity that is reduced or lost upon irradiation with actinic rays or radiation (hereinafter also referred to as a "compound (DB)") is a compound which has a proton-accepting functional group, and decomposes under irradiation with actinic rays or radiation to exhibit deterioration in proton-accepting properties, no proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by General Formula.

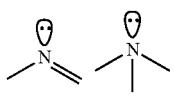

⊕ Unshared electron pair

Preferred examples of the partial structure of the proton-accenting functional group include a crown ether structure, an azacrown ether structure, primary to tertiary amine structures, a pyridine structure, an imidazole structure, and a pyrazine structure.

The compound (DB) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (DB) having the proton-accepting functional group and the proton.

The proton-accepting properties can be confirmed by performing pH measurement.

With regard to specific examples of the compound (DB), reference can be made to those described in paragraphs [0421] to [0428] of JP2014-041328A or paragraphs [0108] to [0116] of JP2014-134686A, the contents of which are incorporated herein by reference.

As the acid diffusion control agent, an onium salt (DC) (hereinafter also referred to as a "compound (DC)") which is a relatively weak acid with respect to a photoacid generator can also be used in the composition of the embodiment of the present invention.

In a case where the photoacid generator and the compound (DC) am mixed and used, a weak acid is discharged by salt exchange, thereby generating an onium salt having a strong acid anion, upon collision of an acid generated from the photoacid generator with an onium salt having an unreacted weak acid anion. In this process, since a strong acid is exchanged with a weak acid having a lower catalytic ability, the acid is deactivated in appearance, and thus, the acid diffusion can be controlled.

As the onium salt which is a weak acid relative to the acid generator, compounds represented by General Formulae (d1-1) to (d1-3) are preferable.

(d1-1)

(d1-2)

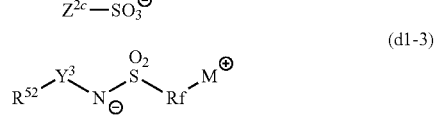

(d1-3)

In the formula, $R^{51}$ represents a hydrocarbon group (preferably an aryl group) which may have a substituent. $Z^{2c}$ represents a hydrocarbon group having 1 to 30 carbon atoms, which may have a substituent (provided that a carbon atom adjacent to S is not substituted with a fluorine atom). $R^{52}$ is an organic group, and $Y^3$ represents a linear, branched, or cyclic alkylene group or arylene group. Rf represents a hydrocarbon group including a fluorine atom. $M^+$'s each independently represent an ammonium cation, a sulfonium cation, or an iodonium cation.

Moreover, as an acid diffusion control agent, for example, the compounds (amine compounds, amido group-containing compounds, urea compounds, nitrogen-containing heterocyclic compounds, and the like) described in paragraphs [0140] to [0144] of JP2013-011833A can also be used.

The acid diffusion control agents may be used singly or in combination of two or more kinds thereof.

The content of the acid diffusion control agent (in a case where the acid diffusion control agents are present in plurality, a total content thereof) in the composition of the embodiment of the present invention is preferably 0.001% to 10% by mass, and more preferably 0.01% to 7.0% by mass with respect to the total solid content of the composition.

<Hydrophobic Resin>

The composition of the embodiment of the present invention may include a hydrophobic resin. Further, the hydrophobic resin is a resin which is different from the resin (X). That is, the hydrophobic resin does not satisfy a requirement that it has the repeating unit represented by General Formula (1) and a requirement that it is an acid-decomposable resin at the same time.

In a case where the composition of the embodiment of the present invention includes the hydrophobic resin, it is possible to control the static/dynamic contact angle on a surface of an actinic ray-sensitive or radiation-sensitive film. By this configuration, it is possible to improve development characteristics, suppress generation of out gas, improve immersion liquid followability upon liquid immersion exposure, and reduce liquid immersion defects, for example.

It is preferable that the hydrophobic resin is designed to be unevenly distributed on a surface of a resist film, but unlike the surfactant, the hydrophobic resin does not necessarily have a hydrophilic group in a molecule thereof and docs not necessarily contribute to homogeneous mixing of polar/non-polar materials.

The hydrophobic resin is preferably a resin having a repeating unit having at least one selected from the group consisting of a "fluorine atom", a "silicon atom", or a "$CH_3$ partial structure which is included in a side chain moiety of a resin" from the viewpoint of uneven distribution on a film surface layer.

In a case where the hydrophobic resin includes a fluorine atom and/or a silicon atom, the fluorine atom and/or the silicon atom described above in the hydrophobic resin may be included in the main chain of a resin or may be included in a side chain.

In a case where the hydrophobic resin has a fluorine atom, it is preferably a resin which has an alkyl group having a fluorine atom (a hexafluoroisopropyl group and the like), a cycloalkyl group having a fluorine atom, or an aryl group having a fluorine atom as a partial structure having a fluorine atom.

In a case where the hydrophobic resin has a CHs partial structure included in a side chain moiety thereof, it is preferable that the hydrophobic resin has a repeating unit having at least one $CH_3$. partial structure in a side chain moiety thereof, it is more preferable that the hydrophobic resin has a repeating unit having at least two $CH_3$ partial structures in a side chain moiety thereof, it is still more preferable that the hydrophobic resin has a repeating unit having at least three $CH_3$ partial structures in a side chain moiety thereof. Further, a methyl group bonded directly to the main chain of the hydrophobic resin (for example, an α-methyl group in the repeating unit having a methacrylic acid structure) makes only a small contribution of uneven distribution to the surface of the hydrophobic resin due to the effect of the main chain, and thus, this shall not included in the above-mentioned $CH_3$ partial structure included in the side chain moiety.

The hydrophobic resin may or may not have one or more repeating units having a group selected from the following groups (x) to (z).
- (x) an acid group,
- (y) a group having a solubility in an alkali developer that increases through decomposition by an action of an alkali developer (hereinafter also referred to as a polarity conversion group), and
- (z) a group that decomposes by an action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

As the acid group (x), the fluorinated alcohol group (preferably a hexafluoroisopropanol group), the sulfonamido group, or the bis(alkylcarbonyl)methylene group is preferable.

Examples of the polarity conversion group (y) include a lactone group, a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—$OSO_2$O—), and a sulfonic ester group (—$SO_2$O—), and the lactone group or the carboxylic ester group (—COO—) is preferable.

The repeating unit including such the group is, for example, a repeating unit in which the group is directly bonded to the main chain of a resin, and examples thereof include a repeating unit with an acrylic ester or a methacrylic ester. In this repeating unit, such the group may be bonded to the main chain of the resin via a linking group. Alternatively, this repeating unit may also be incorporated into a terminal of the resin by using a polymerization initiator or a chain transfer agent having such the group during polymerization.

Examples of the repeating unit having a lactone group include the same ones as those of the repeating unit having a lactone structure described earlier in the section of the resin (X).

The content of the repeating unit having the polarity conversion group (y) is preferably 1% to 100% by mole, more preferably 3% to 98% by mole, and still more preferably 5% to 95% by mole with respect to all the repeating units in the hydrophobic resin.

Examples of the repeating unit having the group (z) that decomposes by an action of an acid in the hydrophobic resin include the same ones as the repeating units having an acid-decomposable group exemplified in the resin (X). The repeating unit having a group (z) that decomposes by an action of an acid may have at least any one of a fluorine atom or a silicon atom. The content of the repeating unit having a group (z) that decomposes by an action of an acid is preferably 1% to 80% by mole, more preferably 10% to 80% by mole, and still more preferably 20% to 60% by mole with respect to all the repeating units in the hydrophobic resin.

The hydrophobic resin may further have a repeating unit which is different from the above-mentioned repeating units.

The content of the repeating unit including a fluorine atom is preferably 10% to 100%. by mole, and more preferably 30% to 100% by mole with respect to all the repeating units in the hydrophobic resin. Further, the content of the repeating units including a silicon atom is preferably 10% to 100% by mole, and more preferably 20% to 100% by mole with respect to all the repeating units in the hydrophobic resin.

On the other hand, in a case where the hydrophobic resin includes a $CH_3$ partial structure in the side chain moiety thereof, a form in which the hydrophobic resin does not substantially include a fluorine atom and a silicon atom is preferable. Further, it is preferable that the hydrophobic resin is constituted with substantially only repeating units which are constituted with only atoms selected from a carbon atom, an oxygen atom, a hydrogen atom, a nitrogen atom, and a sulfur atom.

The weight-average molecular weight of the hydrophobic resin in terms of standard polystyrene is preferably 1,000 to 100,000, and more preferably 1,000 to 50,000.

A total content of the residual monomers and/or oligomer components included in the hydrophobic resin is preferably 0.01% to 5% by mass, and more preferably 0.01% to 3% by mass. In addition, the dispersity (Mw/Mn) is preferably in the range of 1 to 5, and more preferably in the range of 1 to 3.

As the hydrophobic resin, known resins can be appropriately selected and used singly or as a mixture. For example, the known resins disclosed in paragraphs [0451] to [0704] of the specification of US2015/0168830A1 and paragraphs [0340] to [0356] of the specification of US2016/0274458A1 can be suitably used as the hydrophobic resin (E). Further, the repeating units disclosed in paragraphs [0177] to [0258] of the specification of US2016/0237190A1 are also preferable as a repeating unit constituting the hydrophobic resin (E).

The hydrophobic resin may be used singly or in combination of two or more kinds thereof.

It is preferable to use a mixture of two or more kinds of hydrophobic resins having different levels of surface energy from the viewpoint of satisfying both the immersion liquid followability and the development characteristics upon liquid immersion exposure.

The content of the hydrophobic resin in the composition (in a case where the hydrophobic resins are present in plurality, a total content thereof) is preferably 0.01% to 10.0% by mass, and more preferably 0.05% to 8.0% by mass with respect to the total solid content in the composition.

<Surfactant>

The composition of the embodiment of the present invention may include a surfactant. By incorporating the surfactant into the composition, a pattern having improved adhesiveness and less development defects with a good sensitivity and a good resolution in a case of using an exposure light source at a wavelength of 250 nm or less, and particularly 220 nm or less can be formed.

As the surfactant, fluorine-based and/or silicon-based surfactants are preferable.

Examples of the fluorine-based and/or silicon-based surfactants include the surfactants described in paragraph [0276] of the specification of US2008/0248425A. In addition, EFTOP EF301 and EF303 (manufactured by Shin-Akita Chemical Co., Ltd.); FLUORAD FC430, 431, and 4430 (manufactured by Sumitomo 3M Inc.); MEGAFACE F171, F173, F176, F189, F113, F110, F177, F120, and R08 (manufactured by DIC Corp.); SURFLON S-382, SC101, 102, 103, 104, 105, and 106 (manufactured by Asahi Glass Co., Ltd.), TROYSOL S-366 (manufactured by Troy Chemical Corp.): OF-300 and GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA Solutions Inc.); KH-20 (manufactured by Asahi Kasei Co., Ltd.); or FTX-204G, 208G, 218G, 230G, 204D, 208D, 212D, 218D, and 222D (manufactured by NEOS Co., Ltd.) may be used. In addition, a polysiloxane polymer KP-341 (manufactured by Shin-Etsu Chemical Co., Ltd.) can also be used as the silicon-based surfactant.

Moreover, in addition to the known surfactants as shown above, a surfactant may be synthesized using a fluoroaliphatic compound manufactured using a telomerization method (also referred to as a telomer method) or an oligomerization method (also referred to as an oligomer method). Specifically, a polymer including a fluoroaliphatic group derived from fluoroaliphatic compound may be used as the surfactant. This fluoroaliphatic compound can be synthesized, for example, by the method described in JP2002-090991 A.

In addition, a surfactant other than the fluorine-based surfactant and/or the silicon-based surfactants described in paragraph [0280] of the specification of US2008/0248425A may be used.

The surfactant may be used singly or in combination of two or more kinds thereof.

The content of the surfactant in the composition of the embodiment of the present invention is preferably 0.0001% to 2.0% by mass, and more preferably 0.0005% to 1.0% by mass with respect to the total solid content of the composition.

<Solvent>

The composition of the embodiment of the present invention may include a solvent.

The solvent preferably includes at least any one of the following component (M1) or the following component (M2), and among these, the solvent more preferably includes the following component (M1).

In a case where the solvent includes the following component (M1), it is preferable that the solvent consists of substantially only the component (M1) or is a mixed solvent including at least the component (M1) and the component (M2).

Hereinafter, the component (M1) and the component (M2) will be shown.

Component (M1): Propylene glycol monoalkyl ether carboxylate (propylene glycol monomethyl ether acetate (PGMEA) and the like)

Component (M2): A solvent satisfying one or both of requirements as a solvent selected from the following component (M2-1) and a solvent selected from the following component (M2-2).

Component (M2-1): Propylene glycol monoalkyl ether (propylene glycol monomethyl ether (PGME) and the like), lactic ester (ethyl lactate and the like), acetic ester (butyl acetate and the like), butyl butyrate, alkoxypropionic ester, chain ketone, cyclic ketone, lactone (γ-butyrolactone and the like), or alkylene carbonate Component (M2-2): Another solvent having a flash point (also referred to as fp) of 37° C. or higher.

In a case where the solvent and the above-described resin (X) are used in combination, the coating property of the composition is improved and a pattern having a less number of development defects can be obtained. Although a reason therefor is not necessarily clear, it is considered that the solvent has a good balance among the solubility, the boiling point, and the viscosity of the above-described resin (X), and therefore, unevenness in the film thickness of a resist film, generation of precipitates during spin coating, and the like can be suppressed.

As the component (M2-1), PGME, ethyl lactate, ethyl 3-ethoxypropionate, methyl amyl ketone, cyclohexanone, butyl acetate, pentyl acetate, γ-butyrolactone, or propylene carbonate is more preferable.

Specific examples of the component (M2-2) include PGME (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), and propylene carbonate (fp: 132° C.). Among these, PGME, ethyl lactate, pentyl acetate, or cyclohexanone is preferable, and PGME or cyclohexanone is more preferable.

In addition, the "flash point" herein means the value described in a reagent catalog of Tokyo Chemical Industry Co., Ltd. or Sigma-Aldrich Co. LLC.

The mixing ratio (mass ratio: M1/M2) of the component (M1) to the component (M2) is preferably 100/0 to 15/85, more preferably in the range of 100/0 to 40/60, and still more preferably in the range of 100/0 to 60/40, from the viewpoint that the number of development defects is further decreased.

Moreover, the solvent may include solvents other than the component (M1) and the component (M2). In this case, the content of the solvents other than the components (M1) and (M2) is preferably 5% to 30% by mass with respect to the total mass of the solvent.

Examples of such other solvents include ester-based solvents having 7 or more carbon atoms (preferably 7 to 14 carbon atoms, more preferably 7 to 12 carbon atoms, and still more preferably 7 to 10 carbon atoms) and 2 or less heteroatoms. Furthermore, the ester-based solvents having 7 or more carbon atoms and 2 or less heteroatoms do not include solvents corresponding to the above-described component (M2).

As the ester-based solvents having 7 or more carbon atoms and 2 or less heteroatoms, amyl acetate, 2-methylbutyl acetate, 1-methylbutyl acetate, hexyl acetate, pentyl propionate, hexyl propionate, butyl propionate, isobutyl isobutyrate, heptyl propionate, butyl butanoate, or the like is preferable, and isoamyl acetate is more preferable.

<Other Additives>

The composition of the embodiment of the present invention may further include a dissolution inhibiting compound (a compound whose solubility in an organic developer decreases through decomposition by an action of an acid, with a molecular weight thereof being preferably 3,000 or less), a dye, a plasticizer, a light sensitizer, a light absorber, and/or a compound that accelerates dissolution in a developer (for example, a phenol compound having a molecular weight of 1,000 or less, or an alicyclic or aliphatic compound including a carboxyl group).

<Method for Preparing Composition>

The concentration of solid contents in the composition of the embodiment of the present invention is preferably 0.5% to 30% by mass, more preferably 1.0% to 20.0% by mass, and still more preferably 1.0% to 10.0% by mass, from the viewpoint that the coating property is more excellent. Further, in the present specification, the solid content of the composition is intended to mean, in a case where the composition contains a solvent, all the components excluding the solvent, and even a liquid component is considered a solid content as long as it is a component other than the solvent.

Furthermore, the film thickness of the resist film consisting of the composition of the embodiment of the present invention is generally 200 nm or less, and preferably 100 nm or less, from the viewpoint of improving the resolving power. For example, it is preferable that the film thickness of a resist film to be formed is 90 nm or less in order to resolve a 1:1 line-and-space pattern with a line width of 20 nm or less. In a case where the film thickness is 90 nm or less, more excellent resolution performance is obtained due to suppressed pattern collapse upon application of a developing step which will be described later.

In a case of exposure with EUV or EB, the range of the film thickness is preferably 15 to 60 nm. Such a film thickness can be obtained by setting the concentration of the solid content in the composition to an appropriate range to provide the composition with a suitable viscosity and improve the coating property or the film forming property.

The composition of the embodiment of the present invention is preferably used by dissolving the components in a predetermined organic solvent, and filtering the solution through a filter and applying it onto a predetermined support (substrate). The pore size of a filter for use in filtration through the filter is preferably pore size of 0.1 µm or less, more preferably 0.05 µm or less, and still more preferably 0.03 µm or less. The filter is preferably a polytetrafluoroethyleno-made, polyethylene-made, or nylon-made filter. In the filtration through a filter as shown in the specification of JP2002-062667A, circulating filtration may be performed or the filtration may be performed by connecting plural kinds of filters in series or in parallel. In addition, the composition may be filtered in plural times. Furthermore, the composition may be subjected to a deaeration treatment or the like before or after filtration through a filter.

<Uses>

The composition of the embodiment of the present invention relates to an actinic ray-sensitive or radiation-sensitive resin composition whose properties change by undergoing a reaction upon irradiation with actinic rays or radiation. More specifically, the composition of the embodiment of the present invention relates to an actinic ray-sensitive or radiation-sensitive resin composition which is used in a step of manufacturing a semiconductor such as an integrated circuit (IC), for manufacture of a circuit board for a liquid crystal, a thermal head, or the like, the manufacture of a mold structure for imprinting, other photofabrication steps, or production of a planographic printing plate or an acid-curable composition. A pattern to be formed in the present invention can be used in an etching step, an ion implantation step, a bump electrode forming step, a rewiring forming step, microelectromechanical systems (MEMS), or the like.

[Pattern Forming Method]

The present invention also relates to a pattern forming method using the above-mentioned composition. Hereinafter, the pattern forming method of the embodiment of the present invention will be described. In addition, the resist film of the embodiment of the present invention will also be described, together with the pattern forming method.

The pattern forming method of the embodiment of the present invention has:
  (i) a resist film forming step of forming a resist film (actinic ray-sensitive or radiation-sensitive film) on a support with the above-described composition,
  (ii) an exposing step of exposing the resist film (irradiating the resist film with actinic rays or radiation, and
  (iii) a developing step of developing the exposed resist film with a developer.

The pattern forming method of the embodiment of the present invention is not particularly limited as long as it includes the steps (i) to (iii), and may further include the following steps.

In the pattern forming method of the embodiment of the present invention, the exposing method in the exposing step (ii) may be liquid immersion exposure.

The pattern forming method of the embodiment of the present invention preferably includes a prebaking (PB) step (iv) before the exposing step (ii).

The pattern forming method of the embodiment of the present invention preferably includes a post-exposure baking (PEB) step (v) after the exposing step (ii) and before the developing step (iii).

The pattern forming method of the embodiment of the present invention may include the exposing step (ii) a plurality of times.

The pattern forming method of the embodiment of the present invention may include the prebaking step (iv) a plurality of times.

The pattern forming method of the embodiment of the present invention may include the post-exposure baking step (v) a plurality of times.

In the pattern forming method of the embodiment of the present invention, the resist film forming step (i), the exposing step (ii), and the developing step (iii) as mentioned above can be carried out by a generally known method.

In addition, a resist underlayer film (for example, spin on glass (SOG), spin on carbon (SOC), and an antireflection film) may be formed between the resist film and the support, as desired. As a material constituting the resist underlayer film, known organic or inorganic materials can be appropriately used.

A protective film (topcoat) may be formed on the upper layer of the resist film. As the protective film, a known material can be appropriately used.

The film thickness of the protective film is preferably 10 to 200 nm, more preferably 20 to 100 nm, and still more preferably 40 to 80 nm.

The support is not particularly limited, and a substrate which is generally used in a step of manufacturing a semiconductor such as an IC, and a process for manufacturing a circuit board for a liquid crystal, a thermal head, or the like, and other lithographic processes of photofabrication can be used. Specific examples of the support include an inorganic substrate such as silicon, $SiO_2$, and SiN.

For any of the prebaking step (iv) and the post-exposure baking step (v), the baking temperature is preferably 80° C. to 150° C., more preferably 80° C. to 140° C., and still more preferably 80° C. to 130° C.

For any of the prebaking step (iv) and the post-exposure baking step (v), the baking time is preferably 30 to 1,000 seconds, more preferably 60 to 800 seconds, and still more preferably 60 to 600 seconds.

The baking may be performed using a unit included in an exposing device and a developing device, and may also be carried out using a hot plate or the like.

A light source wavelength used in the exposing step (ii) is not limited, and examples thereof include infrared rays, visible light, ultraviolet rays, far ultraviolet rays, extreme ultraviolet rays (EUV), X-rays, and electron beams (EB). Among those, far ultraviolet rays are preferable, and a wavelength thereof is preferably 250 nm or less, more preferably 220 nm or less, and still more preferably 1 to 200 nm. Specific examples thereof include a KrF excimer laser (248 nm), an ArF excimer laser (193 nm), an F2 excimer laser (157 nm), X-rays, EUV (13 nm), and EV, and the ArF excimer laser, EUV, or EB is preferable.

In the developing step (iii), the developer may be either an alkali developer or a developer including an organic solvent (hereinafter also referred to as an organic developer).

As an alkali component included in the alkali developer, a quaternary ammonium salt typified by tetraethylammonium hydroxide is usually used. In addition, an aqueous alkali solution including an alkali component such as an inorganic alkali, primary to tertiary amines, alcohol amines, and cyclic amines can also be used.

The alkali developer may include an appropriate amount of alcohols and/or a surfactant. The alkali concentration of the alkali developer is usually 0.1% to 20% by mass. The pH1 of the alkali developer is usually 10 to 15.

A time period for performing development the using the alkali developer is usually 10 to 300 seconds.

The alkali concentration, the pH, and the development time using the alkali developer can be appropriately adjusted depending on a pattern to be formed.

The organic developer is preferably a developer including at least one organic solvent selected from the group consisting of a ketone-based solvent, an ester-based solvent (butyl acetate and the like), an alcohol-based solvent, an amide-based solvent, an ether-based solvent, and a hydrocarbon-based solvent.

A plurality of the solvents may be mixed or the solvent may be used in admixture with a solvent other than those described above or water. The moisture content in the entire developer is preferably less than 50% by mass, more preferably less than 20% by mass, and still more preferably less than 10% by mass, and particularly preferably, moisture is not substantially included.

The content of the organic solvent with respect to the organic developer is preferably 50% to 100% by mass, more preferably 80% to 100% by mass, still more preferably 90% to 100% by mass, and particularly preferably 95% to 100% by mass with respect to the total amount of the developer.

The organic developer may include an appropriate amount of a known surfactant, as desired.

The content of the surfactant is usually 0.001% to 5% by mass, preferably 0.005% to 2% by mass, and still mom preferably 0.01% to 0.5% by mass with respect to the total amount of the developer.

In addition, the organic developer may include the above-mentioned acid diffusion control agent.

Examples of the developing method include a method in which a substrate is dipped in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously jetted onto a substrate spun at a constant rate while scanning a developer jetting nozzle at a constant rate (a dynamic dispense method).

A combination of a step of performing development using an aqueous alkali solution (an alkali developing step) and a step of performing development using a developer including an organic solvent (an organic solvent developing step) may be used. Thus, a finer pattern can be formed since a pattern can be formed by keeping only a region with an intermediate exposure intensity from not being dissolved.

It is preferable that the pattern forming method of the embodiment of the present invention includes a step of performing washing using a rinsing liquid (a rinsing step) after the developing step (iii).

As the rinsing liquid used in the rinsing step after the developing step with an alkali developer, for example, pure water can be used. The pure water may include an appropriate amount of a surfactant. In this case, after the developing step or the rinsing step, a treatment for removing the developer or the rinsing liquid adhering on a pattern by a supercritical fluid may be added. In addition, after the rinsing step or the treatment using a supercritical fluid, a heating treatment for removing moisture remaining in the pattern may be performed.

The rinsing liquid used in the rinsing step after the developing step with a developer including an organic solvent is not particularly limited as long as the rinsing liquid does not dissolve the pattern, and a solution including a common organic solvent can be used. As the rinsing liquid, a rinsing liquid including at least one organic solvent selected from the group consisting of a hydrocarbon-based solvent, a ketone-based solvent, an ester-based solvent, an alcohol-based solvent, an amide-based solvent, and an ether-based solvent is preferable, and the rinsing liquid including the ester-based solvent or a monohydric alcohol is more preferable.

For the rinsing liquid in the case, a mixture of a plurality of the components may be used, or an organic solvent other than those may be mixed therewith and used.

The moisture content in the rinsing liquid in the case is preferably 10% by mass or less, more preferably 5% by mass or less, and still more preferably 3% by mass or less. By setting the moisture content to 10% by mass or less, good development characteristics are obtained.

The rinsing liquid in the case may include an appropriate amount of a surfactant.

In the rinsing step, the developed substrate is subjected to a washing treatment using the rinsing liquid. A method for the washing treatment is not particularly limited, but examples thereof include a method in which a rinsing liquid is continuously jetted on a substrate rotated at a constant rate (a rotation application method), and the dip method, the puddle method, and the spray method, each described above in the developing method.

It is preferable to rotate the substrate at a rotation speed of 2,000 to 4,000 rpm after the rinsing step, thereby removing the rinsing liquid from the substrate. Furthermore, it is also preferable that the method includes a baking step after the rinsing step. The developer and the rinsing liquid remaining between and inside the patterns are removed by the baking step. In the baking step after the rinsing step, the baking temperature is usually 40° C. to 160° C., and preferably 70° C. to 95° C., and the baking time is usually 10 seconds to 3 minutes, and preferably 30 to 90 seconds.

It is preferable that various materials (for example, a resist solvent, a developer, a rinsing liquid, a composition for forming an antireflection film, and a composition for forming a topcoat) used in the composition of the embodiment of the present invention and the pattern forming method of the embodiment of the present invention include no impurities such as metal components, isomers, and residual monomers. The content of the impurities included in these materials is preferably 1 ppm or less, more preferably 100 ppt or less, and still more preferably 10 ppt or less, and particularly preferably, the impurities are not substantially included (no higher than a detection limit of a measurement device).

[Method for Manufacturing Electronic Device]

Moreover, the present invention further relates to a method for manufacturing an electronic device, the method including the above-described pattern forming method. The electronic device manufactured by the method for manufacturing an electronic device of an embodiment of the present invention is suitably mounted on electric or electronic equipment (for example, home electronics, office automation (OA)-related equipment, media-related equipment, optical equipment, and telecommunication equipment).

EXAMPLES

Hereinafter, the present invention will be described more specifically with reference to Examples, but the present invention is not limited to the following Examples unless it exceeds the gist thereof. In addition, "part" and "%" are based on mass unless otherwise specified.

[Actinic Ray-Sensitive or Radiation-Sensitive Resin Composition]

The actinic ray-sensitive or radiation-sensitive resin composition (composition) used in the present Example will be described below.

<Resin (Acid-Decomposable Resin)>

(Synthesis of Resin A-1)

Synthesis of Monomer (a1)

A monomer (a1) used for the synthesis of a resin A-1 was synthesized by a method shown below according to the following scheme.

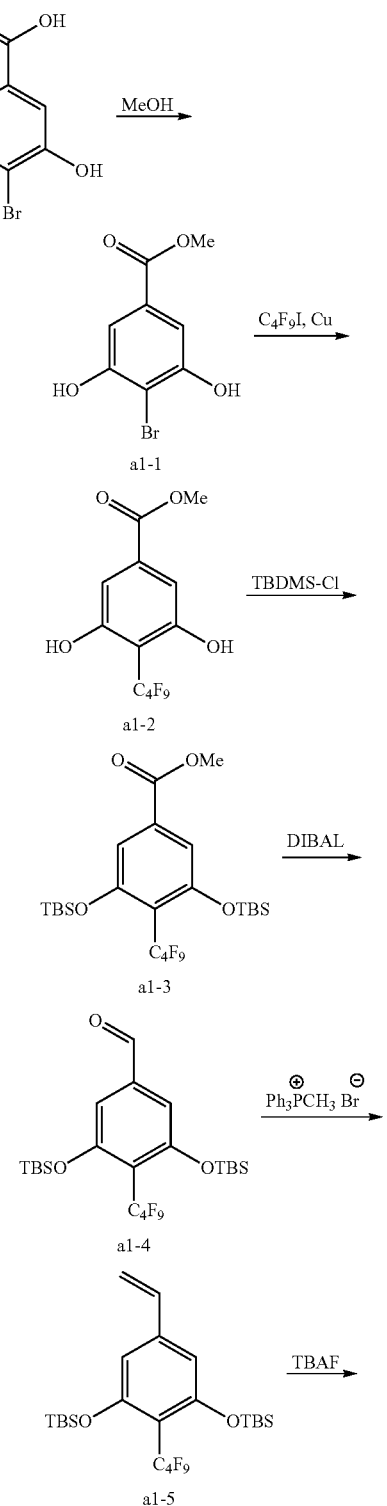

-continued

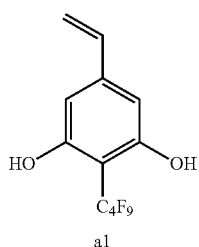

a1

Synthesis of Intermediate a1-1

Methanol (400 ml) was added to 4-bromo-3,5-dihydroxybenzoic acid (80 g), concentrated sulfuric acid (2.7 g) was further added thereto, and the obtained mixed liquid was heated and refluxed for 5 hours. After allowing the mixed liquid to be cooled to room temperature, a saturated aqueous sodium hydrogen carbonate solution (80 ml) was portionwise added thereto, ethyl acetate (80 ml) was further added to the mixture, and the mixture was concentrated under reduced pressure. The crude crystals generated in the mixed liquid were washed with a saturated aqueous sodium hydrogen carbonate solution and collected by filtration. A solid collected by filtration was washed with hexane and further collected by filtration to obtain an intermediate (a1-1) (68 g, yield 80%).

Synthesis of Intermediate a1-2

The intermediate (a1-1) (30 g) was dissolved in N,N'-dimethylformamide (35 ml), and copper powder (35 g), 2,2'-bipyridyl (1.9 g), and nonafluorobutyl iodide. (50 g) were added thereto to obtain a mixed liquid. The mixed liquid was heated and stirred at 80° C. for 15 hours. The mixed liquid was allowed to be cooled to room temperature, ethyl acetate (70 ml) was then added thereto, and the mixture was subjected to filtration through Celite. Ethyl acetate (70 ml) and saturated saline (140 mil) were added to the obtained filtrate, and the filtrate was subjected to a liquid separation operation. The organic phase was washed with saturated saline (140 ml) and then dehydrated with magnesium sulfate. Magnesium sulfate was separated from the organic phase by filtration, and then the solvent was evaporated from the organic phase under reduced pressure. The obtained residue was purified by silica gel column chromatography (eluent: ethyl acetate/n-hexane=25/75 (volume ratio)) to obtain an intermediate (a1-2) (14 g, yield 30%).

Synthesis of Intermediate a1-3

The intermediate (a1-2) (13.4 g) and imidazole (8.3 g) were dissolved in N,N'-dimethylformamide (67 ml), and N,N'-dimethylaminopyridine (0.2 g) was added thereto to obtain a mixed liquid. The obtained mixed liquid was ice-cooled and tert-butyldimethylsilyl chloride (13.8 g) was added, taking care of not generating excessive heat. The mixed liquid was returned to room temperature, stirred for 3 hours, and cooled with ice, and water (150 ml) was added dropwise thereto, taking care of generating excessive heat from the mixed liquid. A mixed solvent (volume ratio of 50/50) (160 ml) of ethyl acetate and hexane was added to the mixed liquid, and the mixture was subjected to a liquid separation operation. The organic phase was washed three times with water (150 ml) and then dehydrated with magnesium sulfate. Magnesium sulfate was separated from the organic phase by filtration, and then the solvent of the organic phase was evaporated under reduced pressure to obtain a crude product (23 g) of the intermediate (a1-3). This crude product was used as it was in the next reaction without further purification.

Synthesis of Intermediate a1-4

The intermediate (a1-3) (21 g) was dissolved in dichloromethane (130 g) to obtain a mixed liquid. A hexane solution of diisobutylaluminum hydride (1 mol/l) (36 ml) was added dropwise to the mixed liquid while keeping the mixed liquid at −60° C. or lower in a nitrogen atmosphere. The mixed liquid was stirred at −60° C. or lower for 30 minutes from the end of the dropwise addition, and then the mixed liquid was slowly added dropwise to 1 mol/hydrochloric acid (200 ml). The obtained solution was subjected to a liquid separation operation and the aqueous phase was extracted twice with dichloromethane (120 g). The obtained organic phase was washed three times with water (150 ml) and then dehydrated with magnesium sulfate. Magnesium sulfate was separated from the organic phase by filtration, and then the solvent of the organic phase was evaporated under reduced pressure. The obtained residue was purified by silica gel column chromatography (eluent: ethyl acetate/n-hexane=2/98 (volume ratio)) to obtain an intermediate (a1-4) (11 g, yield 55%).

Synthesis of Intermediate a1-5

Methyltriphenylphosphonium bromide (7.1 g) was dissolved in THF (65 ml) to obtain a mixed liquid. While cooling the mixed liquid with ice in a nitrogen atmosphere, tert-butoxypotassium (1.6 g) was added to the mixed liquid, taking care of not generating excessive heat. The mixed liquid was allowed to be cooled to room temperature, stirred for 1 hour, and then ice-cooled again, and a solution obtained by mixing the intermediate (a1-4) (9.5 g) and THF (8 ml) was added dropwise thereto, taking care of not generating excessive heat.

The mixed liquid was allowed to be cooled to room temperature and stirred for 3 hours, and then added to a saturated aqueous ammonium chloride solution (200 ml). The obtained solution was extracted three times with 200 ml of ethyl acetate, and then the organic phase was washed three times with water and twice with saturated saline, and dehydrated with magnesium sulfate. Magnesium sulfate was separated from the organic phase by filtration, and then the solvent of the organic phase was evaporated under reduced pressure. A mixed solvent of ethyl acetate and hexane (volume ratio 20/80) (200 ml) was added to the obtained crude crystals, and the precipitated crystals were separated by filtration. The filtrate was concentrated under reduced pressure and then purified by silica gel column chromatography (eluent: ethyl acetate/n-hexane=1/99 (volume ratio)) to purify an intermediate (a1-5) (5 g, yield 53%).

Synthesis of Monomer (a1)

The intermediate (a1-5) (4.8 g) was dissolved in THF (10 ml) to obtain a mixed liquid. While cooling the mixed liquid with ice in a nitrogen atmosphere, a THF liquid (1 mol/l) (18.1 ml) of tetrabutylammonium fluoride was added dropwise to the mixed liquid. The mixed liquid was stirred under ice-cooling for 1 hour, and then added to 0.1 mol/1 hydrochloric acid (100 ml). The obtained solution was extracted three times with ethyl acetate (100 ml), and the organic phase was washed three times with water (100 ml) and dehydrated with sodium sulfate. After sodium sulfate was separated from the organic phase by filtration, 2,6-di-tert-butyl-p-cresol (10 mg) was added to the organic phase, and then the solvent was evaporated under reduced pressure. The obtained residue was purified by silica gel column chromatography (eluent: ethyl acetate/n-hexane=33/67 (volume ratio)) to obtain a monomer (a1) (2.1 g, yield 72%).

In a case where the obtained monomer (a1) was analyzed by an $^1$H-nuclear magnetic resonance (NMR) method, the following results were obtained.

¹H-NMR (Acetone-d6: ppm) δ: 8.98 (s), 6.61 (s), 6.59 (dd), 5.74 (d), 5.31 (d), 5.31 (d)

Synthesis of Resin A-1

A resin (A-1) was synthesized according to the following scheme, using the monomer (a1) obtained above.

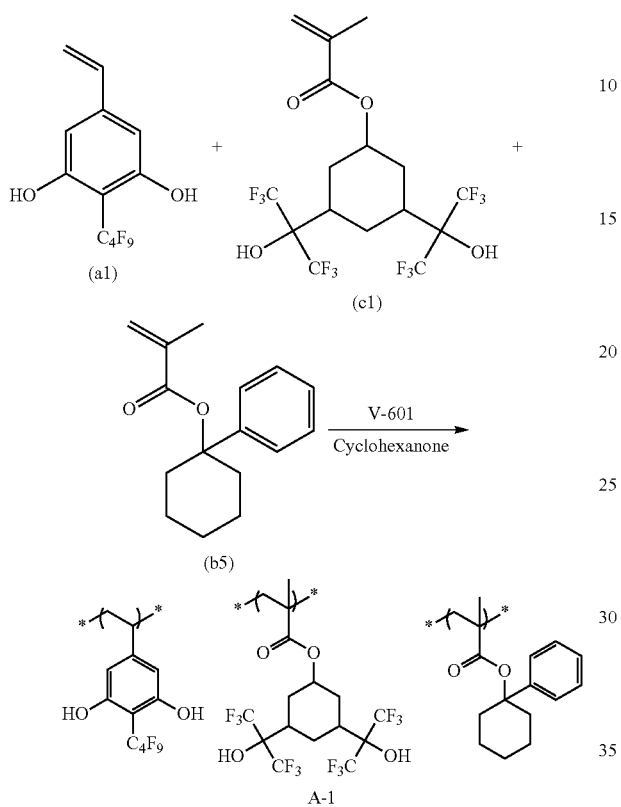

A monomer (ci) (0.8 g), a monomer (a1) (0.4 g), a monomer (b5) (0.8 g), and a polymerization initiator V-601 (manufactured by FUJIFILM Wako Pure Chemical Corporation) (0.11 g) were dissolved in cyclohexanone (3.0 g) to obtain a mixed liquid. A mixed solvent of PGMEA and PGME (PGMEA/PGME 80/20 (mass ratio)) (1.4 g) was put into a reaction vessel, and a mixed liquid including monomers and an initiator was added dropwise to the system at 85'C over 4 hours in a nitrogen gas atmosphere. The obtained reaction solution was heated and stirred for 2 hours, and then allowed to be cooled to room temperature. The reaction solution was added dropwise into n-heptane (70 g) to precipitate the polymer, and the supernatant solvent was removed. N-Heptane (70 g) was added to the residual polymer, the mixture was stirred for 30 minute₃, and a polymer was collected by filtration. The polymer collected by filtration was washed using n-heptane (30 g). The washed polymer was dried under reduced pressure to obtain a resin A-1 (0.9 g).

In a case where the resin A-1 was analyzed by GPC, the weight-average molecular weight was 8,800 and the molecular weight dispersity (Mw/Mn) was 1.90.

In a case where the obtained resin A-1 was analyzed by ¹H-nuclear magnetic resonance spectroscopy (NMR), the following results were obtained.

¹H-NMR (DMSO-d6: ppm) δ: 9.95-9.30, 8.11-7.70, 7.53-6.90, 6.37-5.78, 5.17-4.18, 2.69-0.31 (broad peaks)

Monomers (a2) to (a15) were synthesized with reference to the above-mentioned method for synthesizing the monomer (a1).

In addition, the respective resins described in Table 1 shown in the following section were synthesized by the same method as the above-mentioned method for synthesizing resin A-1, except that the types and the amounts of the monomers used were appropriately changed. Moreover, the respective resins were analyzed by the same method as for the resin A-1.

The repeating units constituting the resins used in the present Examples are shown below. In addition, the repeating units (a1) to (a15) correspond to the above-mentioned monomers (a1) to (a15), respectively.

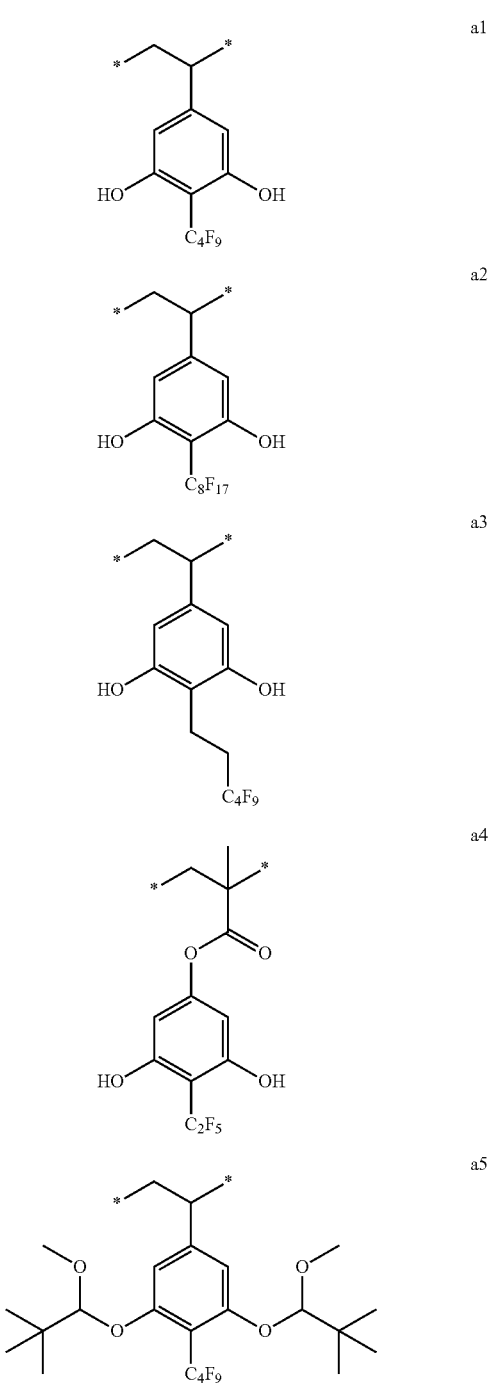

a6 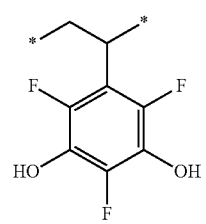
a7 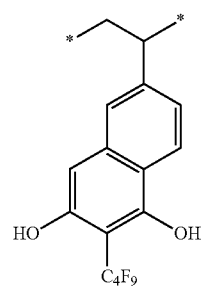
a8 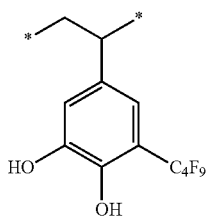
a9 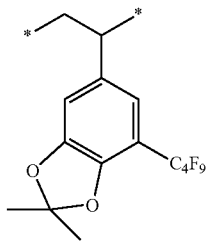
a10 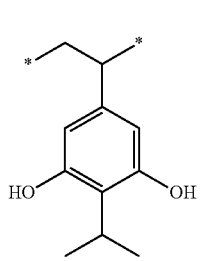
a11 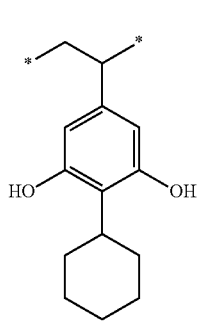
a12 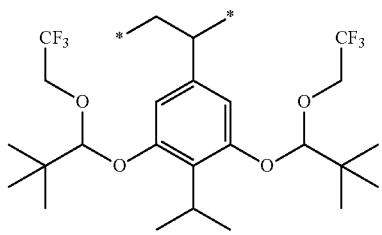
a13 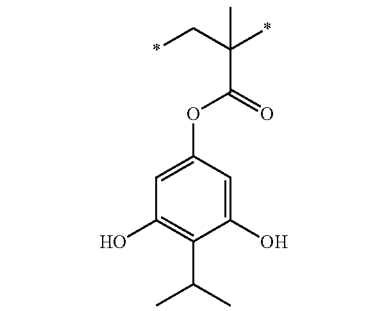
a14 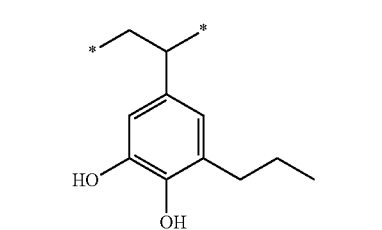
a15 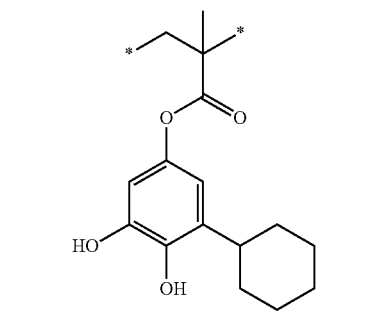
b1 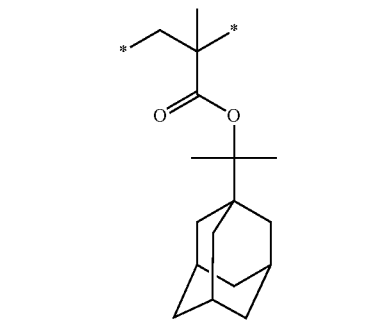

-continued
b2
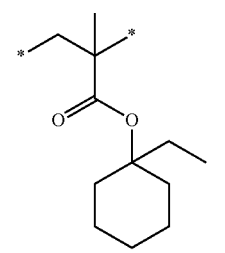
b3
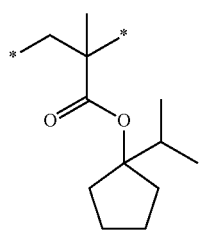
b4
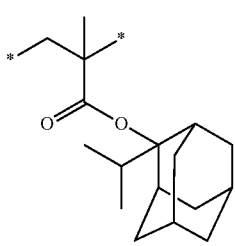
b5
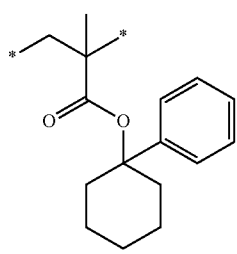
b6
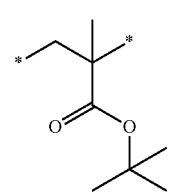
b7
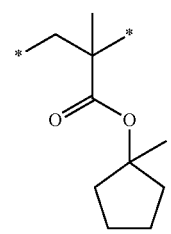
b8
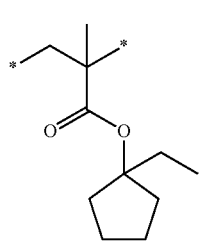
-continued
b9
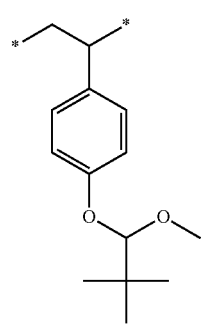
b10
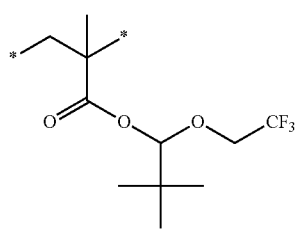
c1
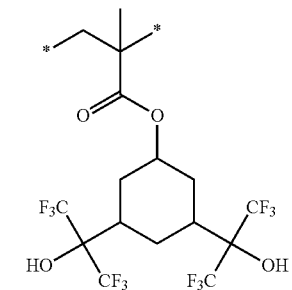
c2
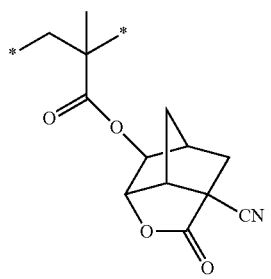
c3
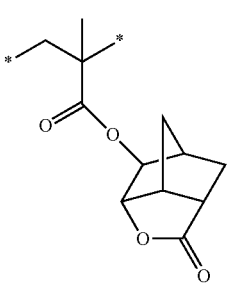

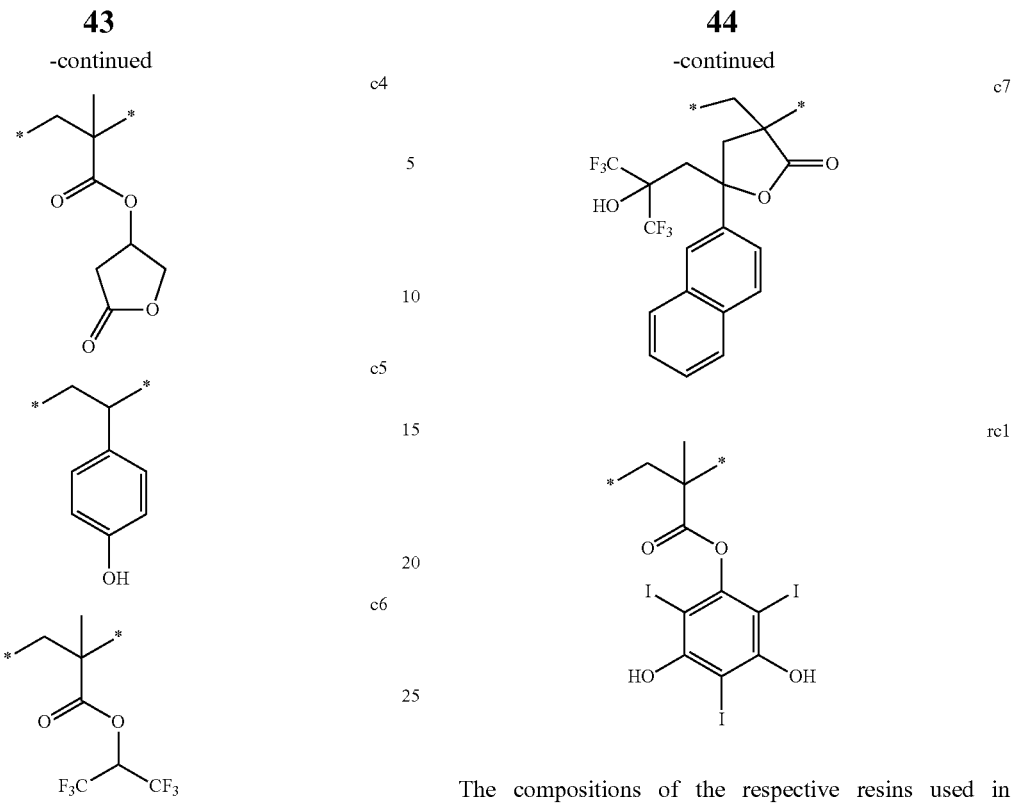

The compositions of the respective resins used in Examples are as follows.

TABLE 1

| | Repeating unit (a) | | Repeating unit (b) | | Repeating unit (c) | | Compositional ratio (mass ratio) | Weight-average molecular weight (Mw) | Dispersity (Mw/Mn) |
|---|---|---|---|---|---|---|---|---|---|
| | 1 | 2 | 1 | 2 | 1 | 2 | | | |
| A-1 | a1 | | b5 | | c1 | | a1/b5/c1 = 20/40/40 | 8,800 | 1.90 |
| A-2 | a1 | | b3 | b4 | c3 | | a1/b3/b4/c3 = 25/25/20/30 | 7,200 | 1.84 |
| A-3 | a2 | | b5 | | c7 | | a2/b5/c7 = 30/35/35 | 5,600 | 1.70 |
| A-4 | a3 | | b1 | | | | a3/b1 = 50/50 | 6,000 | 1.68 |
| A-5 | a3 | | b2 | | c1 | | a3/b2/c1 = 20/40/40 | 8,000 | 1.88 |
| A-6 | a4 | | b3 | | c2 | | a4/b3/c2 = 20/40/40 | 7,000 | 1.81 |
| A-7 | a5 | | b3 | | c1 | c2 | a5/b3/c1/c2 = 25/25/30/20 | 6,500 | 1.82 |
| A-8 | a6 | | b10 | | c3 | | a6/b10/c3 = 30/40/30 | 5,800 | 1.77 |
| A-9 | a7 | | b6 | | c3 | | a7/b6/c3 = 30/40/30 | 6,800 | 1.86 |
| A-10 | a8 | | b9 | | c2 | | a8/b9/c2 = 40/40/20 | 6,200 | 1.76 |
| A-11 | a9 | | | | c1 | | a9/c1 = 50/50 | 7,800 | 1.74 |
| A-12 | a10 | | b3 | | c4 | | a10/b3/c4 = 40/40/20 | 7,200 | 1.76 |
| A-13 | a11 | | b8 | | c1 | | a11/b8/c1 = 20/50/30 | 8,200 | 1.80 |
| A-14 | a12 | | | | | c5 | a12/c5 = 60/40 | 5,400 | 1.64 |
| A-15 | a13 | | b7 | | c6 | | a13/b7/c6 = 30/40/30 | 9,200 | 1.84 |
| A-16 | a14 | | b7 | | c1 | | a14/b7/c1 = 30/50/20 | 6,800 | 1.78 |
| A-17 | a15 | | b10 | | c2 | | a15/b10/c2 = 35/35/30 | 7,700 | 1.77 |
| A-18 | a1 | | b5 | | c1 | | a1/b5/c1 = 22/46/32 | 10,000 | 1.78 |
| A-19 | a1 | | b7 | | c1 | | a1/b7/c1 = 26/37/37 | 7,000 | 1.75 |
| A-20 | a5 | | | | c3 | c5 | a5/c3/c5 = 78/12/10 | 9,000 | 1.72 |
| A-21 | a8 | | b7 | | c3 | | a8/b7/c3 = 45/36/19 | 10,000 | 1.72 |
| A-22 | a10 | | b6 | | c2 | | a10/b6/c1 = 16/39/45 | 8,800 | 1.69 |
| A-23 | a14 | | b7 | | c1 | | a14/b7/c2 = 29/45/26 | 6,800 | 1.66 |
| RA-1 | | | b1 | | | c5 | b1/c5 = 50/50 | 6,400 | 1.76 |
| RA-2 | | | b3 | b4 | rc1 | c5 | b3/b4/rc1/c5 = 34/28/25/13 | 7,600 | 1.88 |
| RA-3 | | | b1 | | rc1 | | b1/rc1 = 50/50 | 6,600 | 1.70 |

<Photoacid Generator>
The following compounds were used as the photoacid generator.
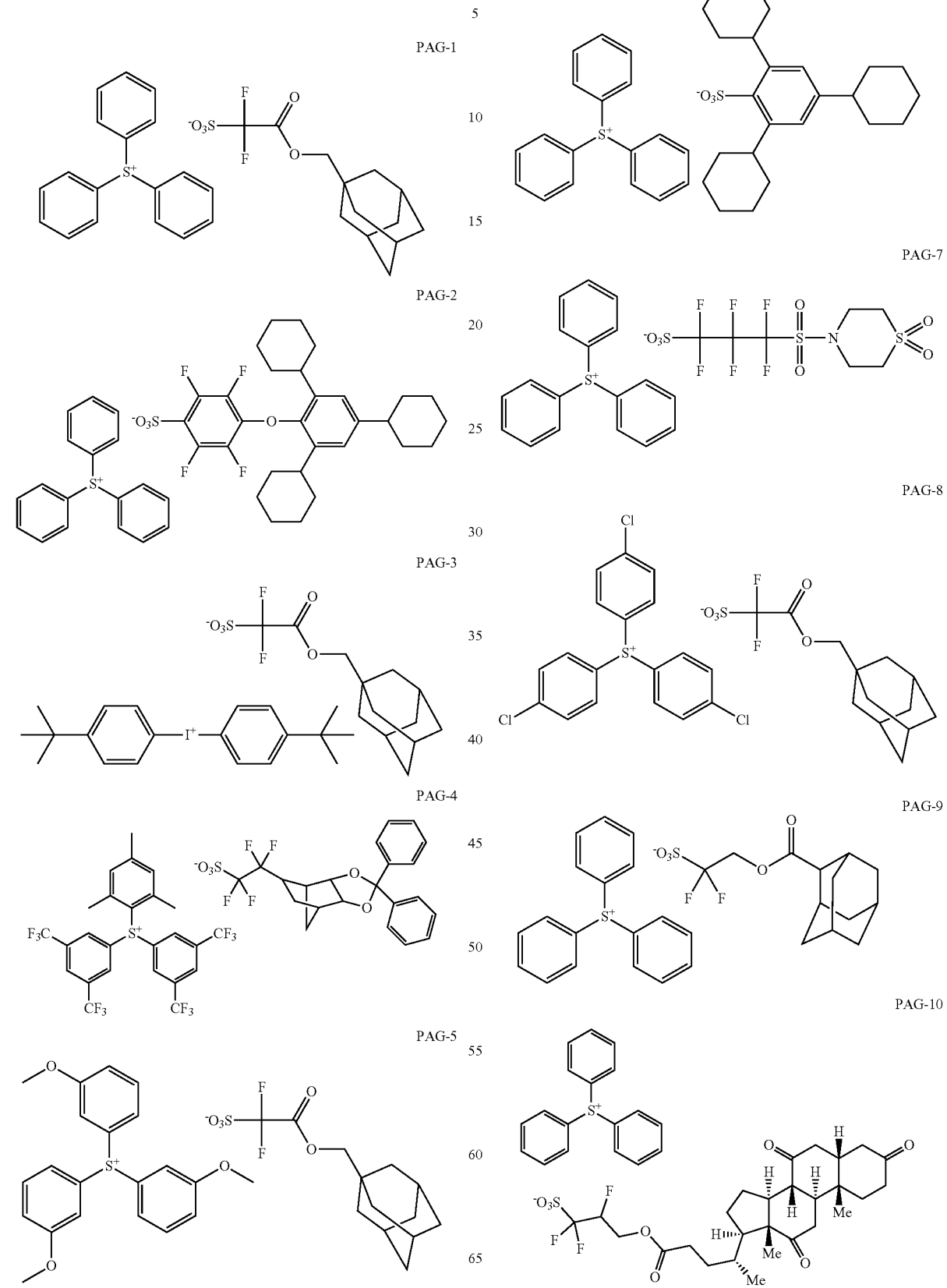

-continued
PAG-11
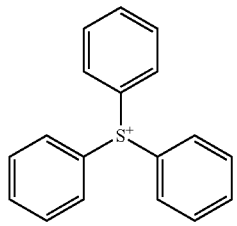 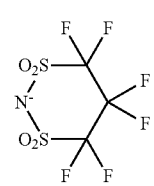
PAG-12
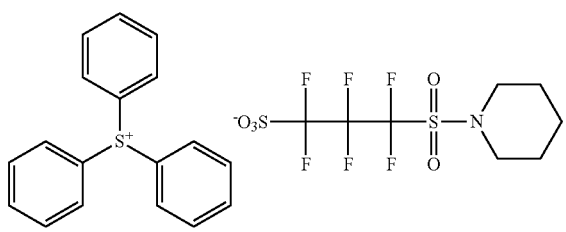
PAG-13
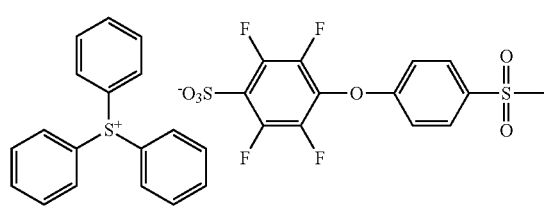
PAG-14
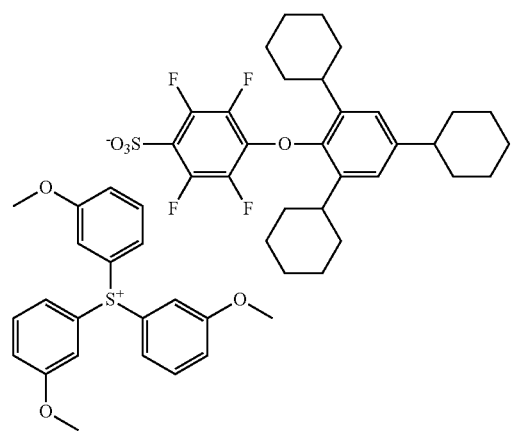
PAG-15
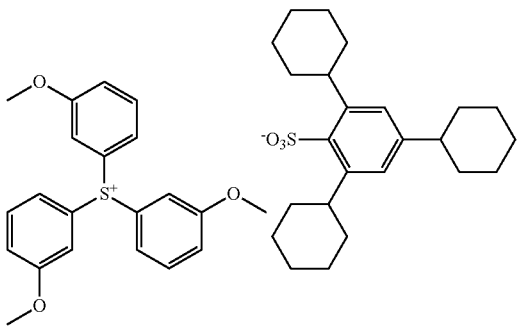
<Acid Diffusion Control Agent>
The following compounds were used as the acid diffusion control agent.
Q-1
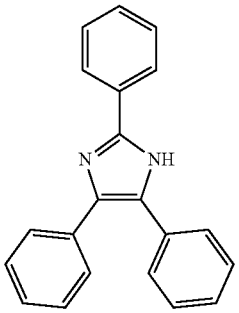
Q-2
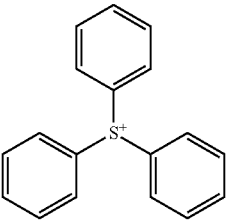
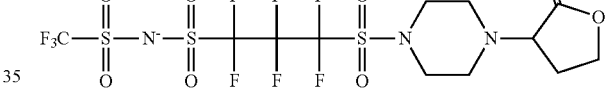
Q-3
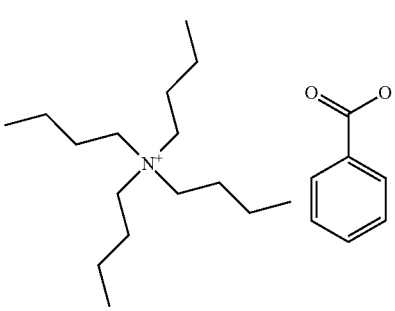
Q-4
Q-5
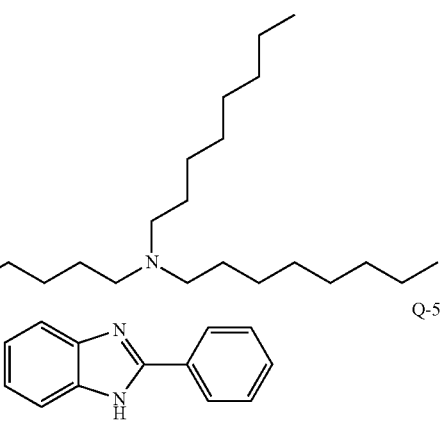

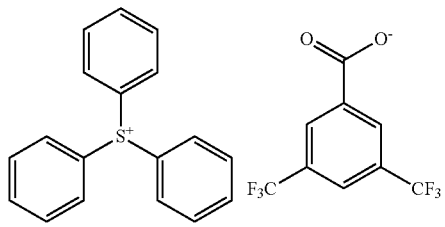

Q-6

<Hydrophobic Resin>

The following compound was used as the hydrophobic resin. The number attached to each repeating unit of the following structural formula is the mole fraction of each repeating unit.

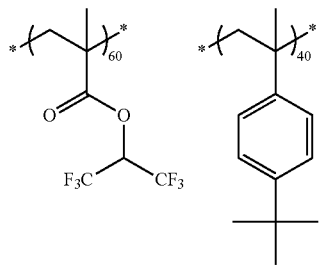

ADP-1

Mw = 8,000
Mw/Mn = 1.5

<Surfactant>

The following compounds were used as the surfactant.
W-1: MEGAFACE F176 (manufactured by DIC Corporation; fluorine-based surfactant)
W-2: MEGAFACE R08 (manufactured by DIC Corporation; fluorine- and silicon-based surfactants)

<Solvent>

The following compounds were used as the solvent.
SL-1: Propylene glycol monomethyl ether acetate (PGMEA)
SL-2: Propylene glycol monomethyl ether (PGME)
SL-3: Ethyl lactate
SL-4: γ-Butyrolactone <Preparation of Composition>

The respective components shown in Table 2 were mixed so as to satisfy a concentration of solid contents of 1.5% by mass and have the composition shown in Table 2. Then, the obtained mixed solution was filtered through a polyethylene filter having a pore size of 0.03 μm to prepare a composition.

In addition, in the composition, the solid content means all the components excluding the solvent. The obtained composition was used in Examples and Comparative Examples.

Moreover, the contents (% by mass) of the respective components described in the following columns of "Resin", "Photoacid generator", "Acid diffusion control agent", and "Surfactant" represent the ratios of the respective components with respect to the total solid content.

Incidentally, in a case where two or more components in the same classification are used, the respective components used and the contents of the respective components are shown together. For example, the composition R-29 includes 30% by mass of the resin A-4 and 50% by mass of the resin A-12, respectively, with respect to the total solid content.

TABLE 2

| | Resin | | Photoacid generator | | Acid diffusion control agent | | Hydrophobic resin | | Surfactant | | Solvent |
|---|---|---|---|---|---|---|---|---|---|---|---|
| | Type | Content (% by mass) | Type | Content (% by mass) | Type | Content (% by mass) | Type | Content (% by mass) | Type | Content (% by mass) | Type (mass ratio) |
| R-1 | A-1 | 80 | PAG-5 | 15 | Q-6 | 5 | Absent | | Absent | | SL-1/SL-2 (80/20) |
| R-2 | A-1 | 80 | PAG-2 | 15 | Q-2 | 5 | Absent | | Absent | | SL-1/SL-4 (60/40) |
| R-3 | A-1 | 80 | PAG-3 | 15 | Q-6 | 5 | Absent | | Absent | | AL-1/SL-2 (60/40) |
| R-4 | A-1 | 80 | PAG-6 | 15 | Q-6 | 5 | Absent | | Absent | | SL-1/SL-2 (80/20) |
| R-5 | A-1 | 80 | PAG-6 | 15 | Q-4 | 5 | Absent | | Absent | | SL-1/SL-3 (80/20) |
| R-6 | A-2 | 80 | PAG-1 | 15 | Q-2 | 5 | Absent | | Absent | | SL-1/SL-2 (60/R-40) |
| R-7 | A-2 | 80 | PAG-14 | 15 | Q-3 | 5 | Absent | | Absent | | SL-1/SL-2 (80/20) |
| R-8 | A-3 | 80 | PAG-4 | 15 | Q-6 | 5 | Absent | | Absent | | SL-1/SL-3 (80/20) |
| R-9 | A-3 | 80 | PAG-15 | 15 | Q-6 | 5 | Absent | | Absent | | SL-1/SL-2 (80/20) |
| R-10 | A-3 | 80 | PAG-15 | 15 | Q-1/Q-6 | 2.5/2.5 | Absent | | Absent | | SL-1/SL-2 (80/20) |
| R-11 | A-4 | 80 | PAG-6 | 15 | Q-1 | 5 | Absent | | Absent | | SL-1/SL-3 (70/30) |
| R-12 | A-4 | 80 | PAG-1 | 15 | Q-2 | 5 | Absent | | Absent | | SL-1/SL-2 (70/30) |
| R-13 | A-4 | 78.2 | PAG-1 | 14.5 | Q-2 | 4.8 | ADP-1 | 2.5 | Absent | | SL-1/SL-2 (70/30) |

TABLE 2-continued

| | Resin | | Photoacid generator | | Acid diffusion control agent | | Hydrophobic resin | | Surfactant | | Solvent |
|---|---|---|---|---|---|---|---|---|---|---|---|
| | Type | Content (% by mass) | Type | Content (% by mass) | Type | Content (% by mass) | Type | Content (% by mass) | Type | Content (% by mass) | Type (mass ratio) |
| R-14 | A-5 | 80 | PAG-14 | 15 | Q-6 | 5 | Absent | | Absent | | SL-1/SL-2 (70/30) |
| R-15 | A-5 | 79.9 | PAG-14 | 15 | Q-6 | 5 | Absent | | W-1 | 0.1 | SL-1/SL-2 (70/30) |
| R-16 | A-5 | 80 | PAG-11 | 15 | Q-1 | 5 | Absent | | Absent | | SL-1/SL-2 (70/30) |
| R-17 | A-5 | 80 | PAG-5/ PAG-14 | 5/10 | Q-1 | 5 | Absent | | Absent | | SL-1/SL-2 (80/20) |
| R-18 | A-6 | 80 | PAG-2 | 15 | Q-5 | 5 | Absent | | Absent | | SL-1/SL-3 (60/40) |
| R-19 | A-7 | 80 | PAG-6 | 15 | Q-3 | 5 | Absent | | Absent | | SL-1/SL-2 (80/20) |
| R-20 | A-7 | 80 | PAG-10 | 15 | Q-1 | 5 | Absent | | Absent | | SL-1/SL-3 (80/20) |
| R-21 | A-8 | 80 | PAG-7 | 15 | Q-5 | 5 | Absent | | Absent | | SL-1/SL-3 (40/60) |
| R-22 | A-9 | 80 | PAG-8 | 15 | Q-3 | 5 | Absent | | Absent | | SL-3/SL-4 (50/50) |
| R-23 | A-9 | 80 | PAG-10 | 15 | Q-3 | 5 | Absent | | Absent | | SL-1/SL-3 (80/20) |
| R-24 | A-10 | 80 | PAG-6 | 15 | Q-2 | 5 | Absent | | Absent | | SL-3/SL-4 (40/60) |
| R-25 | A-10 | 80 | PAG-13 | 15 | Q-6 | 5 | Absent | | Absent | | SL-1/SL-2 (50/50) |
| R-26 | A-11 | 80 | PAG-2 | 15 | Q-6 | 5 | Absent | | Absent | | SL-1/SL-2 (80/20) |
| R-27 | A-12 | 80 | PAG-14 | 15 | Q-4 | 5 | Absent | | Absent | | SL-1/SL-2/ SL-4 (30/40/30) |
| R-28 | A-12 | 80 | PAG-15 | 15 | Q-6 | 5 | Absent | | Absent | | SL-1/SL-2 (80/20) |
| R-29 | A-4/ A-12 | 30/50 | PAG-15 | 15 | Q-6 | 5 | Absent | | Absent | | SL-1/SL-2 (80/20) |
| R-30 | A-13 | 80 | PAG-9 | 15 | Q-1 | 5 | Absent | | Absent | | SL-1/SL-2 (90/10) |
| R-31 | A-14 | 80 | PAG-11 | 15 | Q-2 | 5 | Absent | | Absent | | SL-1/SL-2 (80/20) |
| R-32 | A-14 | 80 | PAG-12 | 15 | Q-4 | 5 | Absent | | Absent | | SL-1/SL-2 (70/30) |
| R-33 | A-15 | 80 | PAG-1 | 15 | Q-6 | 5 | Absent | | Absent | | SL-1/SL-2 (90/10) |
| R-34 | A-16 | 80 | PAG-7 | 15 | Q-1 | 5 | Absent | | Absent | | SL-2/SL-4 (40/60) |
| R-35 | A-17 | 80 | PAG-5 | 15 | Q-2 | 5 | Absent | | Absent | | SL-1/SL-3 (80/20) |
| R-36 | A-18 | 80 | PAG-6 | 15 | Q-2 | 5 | Absent | | Absent | | SL-1/SL-2 (80/20) |
| R-37 | A-18 | 80 | PAG-5/ PAG-14 | 5/10 | Q-1 | 5 | Absent | | Absent | | SL-1/SL-3 (80/20) |
| R-38 | A-19 | 80 | PAG-5 | 15 | Q-1 | 5 | Absent | | Absent | | SL-1/SL-2 (80/20) |
| R-39 | A-19 | 80 | PAG-9 | 15 | Q-1 | 5 | Absent | | Absent | | SL1/SL-2 (60/40) |
| R-40 | A-19 | 80 | PAG-9 | 15 | Q-1/Q-2 | 2.5/2.5 | Absent | | Absent | | SL-1/SL-2 (60/40) |
| R-41 | A-20 | 80 | PAG-1 | 15 | Q-2 | 5 | Absent | | Absent | | SL-1/SL-3 (70/30) |
| R-42 | A-20 | 79.9 | PAG-1 | 15 | Q-2 | 5 | Absent | | W-2 | 0.1 | SL-1/SL-3 (70/30) |
| R-43 | A-21 | 80 | PAG-14 | 15 | Q-6 | 5 | Absent | | Absent | | SL-2/SL-4 (40/60) |
| R-44 | A-22 | 80 | PAG-2 | 15 | Q-1 | 5 | Absent | | Absent | | SL-1/SL-4 (60/40) |
| R-45 | A-19/ A-22 | 30/50 | PAG-2 | 15 | Q-1 | 5 | Absent | | Absent | | SL-1/SL-4 (60/40) |
| R-46 | A-23 | 80 | PAG-11 | 15 | Q-4 | 5 | Absent | | Absent | | SL-3/SL-4 (50/50) |
| CR-1 | RA-1 | 80 | PAG-1 | 15 | Q-2 | 5 | Absent | | Absent | | SL-1/SL-2 (70/30) |
| CR-2 | RA-2 | 80 | PAG-1 | 15 | Q-2 | 5 | Absent | | Absent | | SL-1/SL-2 (70/30) |

TABLE 2-continued

| | | | | | | | | | | |
|---|---|---|---|---|---|---|---|---|---|---|
| | Resin | | Photoacid generator | | Acid diffusion control agent | | Hydrophobic resin | | Surfactant | Solvent |
| Type | Content (% by mass) | Type | Content (% by mass) | Type | Content (% by mass) | Type | Content (% by mass) | Type | Content (% by mass) | Type (mass ratio) |
| CR-3 | RA-3 80 | PAG-1 | 15 | Q-2 | 5 | Absent | | Absent | | SL-1/SL-2 (70/30) |

[Pattern Formation]
<EUV Exposure, Alkai Development, and Positive Tone>

The prepared composition was uniformly applied onto a hexamethyldisilane-treated silicon substrate, using a spin coater. Then, the composition was heated and dried at 120° C. for 90 seconds on a hot plate to form a resist film with a film thickness of 35 nm.

The resist film was subjected to patternwise exposure through a reflective mask with a pitch of 40 nm and a line width of 20 nm, using an EUV exposure machine (manufactured by ASML; NXE3350, NA 0.33, Dipole 90°, outer sigma 0.87, inner sigma 0.35). Then, the resist film was baked (post-exposure baking (PEB)) at 120° C. for 60 second.

Subsequently, the resist film was developed by performing puddling for 30 seconds using a 2.38%-by-mass aqueous tetramethylammonium hydroxide solution as a developer, and rinsed by performing puddling for 20 seconds using pure water as a rinsing liquid, and then the silicon wafer was rotated at 30 seconds at a rotation speed of 4,000 rpm to form a line-and-space pattern.

<Electron Beam (EB) Exposure, Alkali Development, and Positive Tone>

The prepared composition was uniformly applied onto a hexamethyldisilazane-treated silicon substrate, using a spin coater. Then, the composition was heated and dried at 120° C. for 90 seconds on a hot plate to form a resist film with a film thickness of 35 nm.

The obtained resist film was irradiated with electron beams through a 6% halftone mask with a line width of 20 nm and a 1:1 line-and-space pattern, using an electron beam irradiation device (HL750 manufactured by Hitachi, Ltd., accelerating voltage of 50 keV). Immediately after irradiation, the resist film was heated on a hot plate at 110° C. for 60 seconds. The resist film was further developed at 23° C. for 60 seconds using a 2.38%-by-mass aqueous tetramethylammonium hydroxide (TMAH) solution, rinsed with pure water for 30 seconds, and then spin-dried to obtain a positive tone pattern.

<EUV Exposure, Organic Solvent Development, and Negative Tone>

The prepared composition was uniformly applied onto a hexamethyldisilazane-treated silicon substrate, using a spin coater. Then, the composition was heated and dried at 120° C. for 90 seconds on a hot plate to form a resist film with a film thickness of 50 nm.

The resist film was subjected to patternwise exposure through a reflective mask with a pitch of 40 nm and a line width of 20 nm, using an EUV exposure machine (manufactured by ASML; NXE3350, NA 0.33, Dipole 90°, outer sigma 0.87, inner sigma 0.35). Then, the resist film was baked (post-exposure baking (PEB)) at 120° C. for 60 second.

Subsequently, the resist film was developed by performing puddling for 30 seconds using butyl acetate as a developer, and a rinsing step was carried out, as desired. In a case where the rinsing step was carried out, the resist film was rinsed by performing puddling for 20 second using isoamyl acetate as a rinsing liquid. After development (after rinsing in a case where the rinsing step was performed), the silicon wafer was rotated at a rotation speed of 4,000 rpm for 30 seconds, and then baked at 90° C. for 60 seconds to form a line-and-space negative tone pattern.

[Evaluation]
<LER (LER Performance)>

While changing an exposure dose, the line width of the line-and-space pattern was measured, and an exposure dose at which the line width reached 20 nm was defined as an optimum exposure dose. While the line-and-space resist pattern resolved at the optimal exposure dose was observed from a top of the pattern with a critical dimension scanning electron microscope (SEM (CG-4100 manufactured by Hitachi High Technologies Corporation)), a distance from the center of the pattern to an edge was measured at 100 points of any points and a measurement deviation thereof was evaluated as 3σ (nm). The smaller the LER value, the better the LER performance.

<Marginal Pattern Width (Collapse Suppressing Ability)>

The line width of a line-and-space pattern was changed while an exposure dose upon exposure was changed. At this time, a minimum line width with which the pattern was resolved without a collapse over 10 μm square was defined as a marginal pattern width (nm). A smaller value thereof indicates that a margin of the pattern collapse is wider and the collapse suppressing ability is better.

[Results]
<EUV Exposure, Alkali Development, and Positive Tone>

The evaluation results with regard to the LER (LER performance) and the marginal pattern width (collapse suppressing ability) in a case where a pattern was formed by EUV exposure and alkali development are shown in Table 3.

In the table, the column of "Unit (a)" indicates the type of the repeating unit represented by General Formula (1) contained in a resin used.

Incidentally, in a case where the composition used includes two or more kinds of resins, the types of repeating units represented by General Formula (1) contained in each resin are also described. For example, the composition R29 used in Example A29 includes a resin having a3 and a resin having a10 as the repeating unit represented by General Formula (1).

The column of "Y" indicates whether or not the group represented by Y in the repeating unit represented by General Formula (1) in the resin used in the composition is an organic group having a fluorine atom or a fluorine atom (Requirement 1). A case where the requirement 1 was satisfied was designated as A, and a case where the requirement 1 was not satisfied was designated as B.

The column of "Formula (2)" indicates whether the repeating unit represented by General Formula (1) in the resin is the repeating unit represented by General Formula (2) in a case where the resin used in the composition satisfies the requirement 1. A case where the present requirement was satisfied was designated as A, and a case where the present requirement was not satisfied was designated as B.

The column of "Formula (3)" indicates whether the repeating unit represented by General Formula (1) in the resin is the repeating unit represented by General Formula (3) in a case where the resin used in the composition does not satisfy the requirement 1. A case where the present requirement was satisfied was designated as A, and a case where the present requirement was not satisfied was designated as B.

The column of "F-containing unit" indicates whether the resin used in the composition has a repeating unit having a fluorine atom, which is different from the repeating unit represented by General Formula (1). A case where the present requirement was satisfied was designated as A, and a case where the present requirement was not satisfied was designated as B.

From the results shown in the table, it was confirmed that the problems of the present invention can be solved by using the composition of the embodiment of the present invention.

Moreover, it was confined that in a case where in General Formula (1), Y is a monovalent organic group having a fluorine atom or a fluorine atom, the composition tends to have a more excellent collapse suppressing ability (results of Examples A1 to A26, and the like).

Furthermore, in this case, it was confirmed that in a case where the repeating unit represented by General Formula (1) is the repeating unit represented by General Formula (2), the composition tends to have a more excellent collapse suppressing ability (results of Examples A1 to A20, and the like).

It was confirmed that in a case where in General Formula (1), Y is not a monovalent organic group having a fluorine atom or a fluorine atom, the composition tends to have a more excellent collapse suppressing ability in a case where the repeating unit represented by General Formula (1) is the repeating unit represented by General Formula (3) (comparison of Examples A27 to 33 vs. Examples A34 and A35, and the like).

TABLE 3

| | | | Characteristics | | | | | Results | |
| | | | Resin | | | | | | |
| | Composition | Type | Unit (a) | Y | Formula (2) | Formula (3) | F-containing unit | LER | Margin pattern width |
|---|---|---|---|---|---|---|---|---|---|
| Example A1 | R-1 | A-1 | a1 | A | A | — | A | 4.1 | 18 |
| Example A2 | R-2 | A-1 | a1 | A | A | — | A | 4.2 | 18 |
| Example A3 | R-3 | A-1 | a1 | A | A | — | A | 4.2 | 18 |
| Example A4 | R-4 | A-1 | a1 | A | A | — | A | 4.1 | 18 |
| Example A5 | R-5 | A-1 | a1 | A | A | — | A | 4.2 | 18 |
| Example A6 | R-6 | A-2 | a1 | A | A | — | B | 4.3 | 18 |
| Example A7 | R-7 | A-2 | a1 | A | A | — | B | 4.3 | 18 |
| Example A8 | R-8 | A-3 | a2 | A | A | — | A | 4.0 | 18 |
| Example A9 | R-9 | A-3 | a2 | A | A | — | A | 4.0 | 18 |
| Example A10 | R-10 | A-3 | a2 | A | A | — | A | 4.1 | 18 |
| Example A11 | R-11 | A-4 | a3 | A | A | — | B | 4.3 | 18 |
| Example A12 | R-12 | A-4 | a3 | A | A | — | B | 4.3 | 18 |
| Example A13 | R-13 | A-4 | a3 | A | A | — | B | 4.3 | 18 |
| Example A14 | R-14 | A-5 | a3 | A | A | — | A | 4.1 | 18 |
| Example A15 | R-15 | A-5 | a3 | A | A | — | A | 4.1 | 18 |
| Example A16 | R-16 | A-5 | a3 | A | A | — | A | 4.2 | 18 |
| Example A17 | R-17 | A-5 | a3 | A | A | — | A | 4.1 | 18 |
| Example A18 | R-18 | A-6 | a4 | A | A | — | B | 4.3 | 18 |
| Example A19 | R-19 | A-7 | a5 | A | A | — | A | 4.2 | 18 |
| Example 420 | R-20 | A-7 | a5 | A | A | — | A | 4.2 | 18 |
| Example A21 | R-21 | A-8 | a6 | A | B | — | A | 4.2 | 19 |
| Example A22 | R-22 | A-9 | a7 | A | B | — | B | 4.4 | 19 |
| Example A23 | R-23 | A-9 | a7 | A | B | — | B | 4.3 | 19 |
| Example A24 | R-24 | A-10 | a8 | A | B | — | B | 4.3 | 19 |
| Example A25 | R-25 | A-10 | a8 | A | B | — | B | 4.3 | 19 |
| Example A26 | R-26 | A-11 | a9 | A | B | — | A | 4.2 | 19 |
| Example A27 | R-27 | A-12 | a10 | B | — | A | B | 4.6 | 20 |
| Example A28 | R-28 | A-12 | a10 | B | — | A | B | 4.5 | 20 |
| Example A29 | R-29 | A-4/A-12 | a3/a10 | A/B | A/— | —/A | B/B | 4.5 | 19 |
| Example A30 | R-30 | A-13 | a11 | B | — | A | A | 4.4 | 20 |
| Example A31 | R-31 | A-14 | a12 | B | — | A | B | 4.5 | 20 |
| Example A32 | R-32 | A-14 | a12 | B | — | A | B | 4.5 | 20 |
| Example A33 | R-33 | A-15 | a13 | B | — | A | A | 4.4 | 20 |
| Example A34 | R-34 | A-16 | a14 | B | — | B | A | 4.3 | 21 |
| Example A35 | R-35 | A-17 | a15 | B | — | B | A | 4.5 | 21 |
| Comparative Example A1 | CR-1 | RA-1 | | | | | B | Not analyzed | |
| Comparative Example A2 | CR-2 | RA-2 | | | | | B | 4.7 | 23 |

It was confirmed that in a case where the resin (resin (X)) in the composition has a repeating unit having a fluorine atom, which is different from the repeating unit represented by General Formula (1), the composition has more excellent LER performance (comparison of Examples A1 to A5, A8 to A10, A14 to A17, A19 to A20 vs. Examples A6 and A7, A11 to A13, and A18 (comparison between the compositions in which the repeating unit represented by General Formula (1) in the resin is the repeating unit represented by General Formula (2), and the like).

<Electron Beam (EB) Exposure, Alkali Development, and Positive Tone>

The evaluation results with regard to the LER (LER performance) and the marginal pattern width (collapse suppressing ability) in a case where a pattern was formed by EB exposure and alkali development are shown in Table 4.

The meanings of the respective columns in Table 4 are each the same as the corresponding columns in Table 3.

TABLE 4

| | | Characteristics | | | | | | Results | |
|---|---|---|---|---|---|---|---|---|---|
| | | Resin | | | | | | | |
| | Composition | Type | Unit (a) | Y | Formula (2) | Formula (3) | F-containing unit | LER | Margin pattern width |
| Example B1 | R-1 | A-1 | a1 | A | A | — | A | 3.9 | 19 |
| Example B2 | R-5 | A-1 | a1 | A | A | — | A | 4.0 | 19 |
| Example B3 | R-8 | A-3 | a2 | A | A | — | A | 3.9 | 19 |
| Example B4 | R-11 | A-4 | a3 | A | A | — | B | 4.1 | 19 |
| Example B5 | R-18 | A-6 | a4 | A | A | — | B | 4.1 | 19 |
| Example B6 | R-19 | A-7 | a5 | A | A | — | A | 4.0 | 19 |
| Example B7 | R-24 | A-10 | a8 | A | B | — | B | 4.3 | 20 |
| Example B8 | R-27 | A-12 | a10 | B | — | A | B | 4.3 | 21 |
| Example B9 | R-35 | A-17 | a15 | B | — | B | A | 4.4 | 22 |
| Comparative Example B1 | CR-1 | RA-1 | | | | | B | Not analyzed | |
| Comparative Example B2 | CR-2 | RA-2 | | | | | B | 4.6 | 25 |

From the results shown in the table, it was confirmed that the problems of the present invention can be solved by using the composition of the embodiment of the present invention even in a case where a pattern was formed by EB exposure and alkali development.

In addition, with regard to the LER performance and the collapse suppressing ability, even in a case where a pattern was formed by EB exposure and alkali development, the same tendency as in a case where the pattern was formed by EUV exposure and alkali development could be seen.

<EUV Exposure, Organic Solvent Development, and Negative Tone>

The evaluation results with regard to the LER (LER performance) and the marginal pattern width (collapse suppressing ability) in a case where a pattern was formed by EUV exposure and solvent development are shown in Table 5.

The meanings of the respective columns in Table 5 are each the same as the corresponding columns in Table 3.

TABLE 5

| | | Characteristics | | | | | | | Results | |
|---|---|---|---|---|---|---|---|---|---|---|
| | | Resin | | | | | | | | |
| | Composition | Type | Unit (a) | Y | Formula (2) | Formula (3) | F-containing unit | Rinsing | LER | Margin pattern width |
| Example C1 | R-11 | A-4 | a3 | A | A | — | B | Not performed | 4.4 | 19 |
| Example C2 | R-12 | A-4 | a3 | A | A | — | B | Not performed | 4.5 | 19 |
| Example C3 | R-13 | A-4 | a3 | A | A | — | B | Not performed | 4.4 | 19 |
| Example C4 | R-22 | A-9 | a7 | A | B | — | B | Not performed | 4.5 | 20 |
| Example C5 | R-36 | A-18 | a1 | A | A | — | A | Not performed | 4.3 | 19 |
| Example C6 | K-37 | A-18 | a1 | A | A | — | A | Not performed | 4.3 | 19 |
| Example C7 | R-38 | A-19 | a1 | A | A | — | A | Not performed | 4.3 | 19 |
| Example C8 | R-38 | A-19 | a1 | A | A | — | A | Performed | 4.2 | 19 |
| Example C9 | R-39 | A-19 | a1 | A | A | — | A | Not performed | 4.3 | 19 |

TABLE 5-continued

| | | Resin | | | | | | Results | |
|---|---|---|---|---|---|---|---|---|---|
| | Composition | Type | Unit (a) | Y | Formula (2) | Formula (3) | F-containing unit | Rinsing | LER | Margin pattern width |
| Example C10 | R-40 | A-19 | a1 | A | A | — | A | Not performed | 4.3 | 19 |
| Example C11 | R-41 | A-20 | a5 | A | A | — | B | Not performed | 4.4 | 19 |
| Example C12 | K-42 | A-20 | a5 | A | A | — | B | Not performed | 4.4 | 19 |
| Example C13 | R-43 | A-21 | a8 | A | B | — | B | Not performed | 4.5 | 20 |
| Example C14 | R-44 | A-22 | a10 | B | — | A | B | Not performned | 4.7 | 21 |
| Example C15 | R-45 | A-19/A-22 | a1/a10 | A/B | A/— | —/A | A/ | Not performed | 4.5 | 20 |
| Example C16 | R-46 | A-23 | a14 | B | — | B | A | Not performed | 4.6 | 22 |
| Comparative Example C1 | CR-1 | RA-1 | | | | | B | Not performed | Not analyzed | |
| Comparative Example C2 | CR-3 | RA-3 | | | | | B | Not performed | 4.9 | 24 |

From the results shown in the table, it was confirmed that the problems of the present invention can be solved by using the composition of the embodiment of the present invention even in a case where a pattern was formed by EUV exposure and solvent development.

Furthermore, with regard to the LER performance and the collapse suppressing ability, even in a case where a pattern was formed by EUV exposure and solvent development, the same tendency as in a case where the pattern was formed by EUV exposure and alkali development could be seen.

In addition, it was confirmed that the LER of the obtained pattern was more excellent by carrying out a rinsing step (comparison of Examples C7 vs. C8).

What is claimed is:

1. An actinic ray-sensitive or radiation-sensitive resin composition comprising:
   an acid-decomposable resin having a repeating unit represented by General Formula (1); and
   a compound that generates an acid upon irradiation with actinic rays or radiation,
   wherein the acid-decomposable resin has a repeating unit having a lactone structure or a repeating unit having a fluorine atom which is different from the repeating unit represented by General Formula (1),

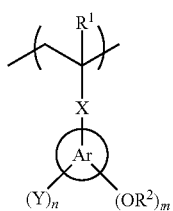

(1)

in General Formula (1), m represents an integer of 2 or more,
n represents an integer of 1 or more,
$R^1$ represents a hydrogen atom, a halogen atom, an alkyl group, a cycloalkyl group, a cyano group, or an alkoxycarbonyl group,
X represents a single bond, —COO—, or —CONR$^3$—,
Ar represents an aromatic ring group,
$R^2$ represents a hydrogen atom or an acid-eliminable group,
$R^3$ represents a hydrogen atom or an alkyl group,
Y represents an organic group other than OR$^2$, or a fluorine atom,
$R^2$'s present in plurality may be the same as or different from each other, and in a case where n is 2 or more, Y's present in plurality may be the same as or different from each other.

2. The actinic ray-sensitive or radiation-sensitive resin composition according to claim 1,
wherein in General Formula (1), Y represents an organic group other than OR$^2$, which has a fluorine atom, or a fluorine atom.

3. The actinic ray-sensitive or radiation-sensitive resin composition according to claim 1,
wherein the repeating unit represented by General Formula (1) is a repeating unit represented by General Formula (2),

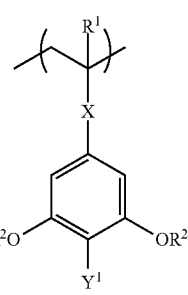

(2)

in General Formula (2), $R^1$ represents a hydrogen atom, a halogen atom, an alkyl group, a cycloalkyl group, a cyano group, or an alkoxycarbonyl group,
X represents a single bond, —COO—, or —CONR$^3$—,
$R^2$ represents a hydrogen atom or an acid-eliminable group,
$R^3$ represents a hydrogen atom or an alkyl group,
$Y^1$ represents an organic group other than OR$^2$, which has a fluorine atom, or a fluorine atom, and
$R^2$'s present in plurality may be the same as or different from each other.

4. The actinic ray-sensitive or radiation-sensitive resin composition according to claim 1,
wherein the repeating unit represented by General Formula (1) is a repeating unit represented by General Formula (3), (3)

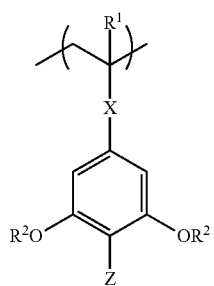

in General Formula (3), $R^1$ represents a hydrogen atom, a halogen atom, an alkyl group, a cycloalkyl group, a cyano group, or an alkoxycarbonyl group, X represents a single bond, —COO—, or —CONR³—, $R^2$ represents a hydrogen atom or an acid-eliminable group, $R^3$ represents a hydrogen atom or an alkyl group, Z represents an organic group other than $OR^2$, which has no fluorine atom, and $R^2$'s present in plurality may be the same as or different from each other.

5. A resist film formed from the actinic ray-sensitive or radiation-sensitive resin composition according to claim 1.

6. A pattern forming method comprising:
a step of forming a resist film using the actinic ray-sensitive or radiation-sensitive resin composition according to claim 1;
a step of exposing the resist film; and
a step of developing the exposed resist film using a developer.

7. A method for manufacturing an electronic device, comprising the pattern forming method according to claim 6.

8. The actinic ray-sensitive or radiation-sensitive resin composition according to claim 2,
wherein the repeating unit represented by General Formula (1) is a repeating unit represented by General Formula (2), (2)

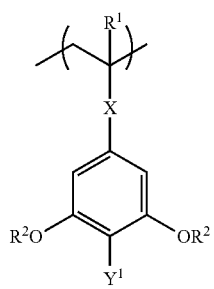

in General Formula (2), $R^1$ represents a hydrogen atom, a halogen atom, an alkyl group, a cycloalkyl group, a cyano group, or an alkoxycarbonyl group, X represents a single bond, —COO—, or —CONR³—, $R^2$ represents a hydrogen atom or an acid-eliminable group, $R^3$ represents a hydrogen atom or an alkyl group, $Y^1$ represents an organic group other than $OR^2$, which has a fluorine atom, or a fluorine atom, and $R^2$'s present in plurality may be the same as or different from each other.

9. The actinic ray-sensitive or radiation-sensitive resin composition according to claim 2,
wherein the acid-decomposable resin further has a repeating unit having a fluorine atom, which is different from the repeating unit represented by General Formula (1).

10. A resist film formed from the actinic ray-sensitive or radiation-sensitive resin composition according to claim 2.

11. A pattern forming method comprising:
a step of forming a resist film using the actinic ray-sensitive or radiation-sensitive resin composition according to claim 2;
a step of exposing the resist film; and
a step of developing the exposed resist film using a developer.

12. A method for manufacturing an electronic device, comprising the pattern forming method according to claim 11.

13. The actinic ray-sensitive or radiation-sensitive resin composition according to claim 3,
wherein the acid-decomposable resin further has a repeating unit having a fluorine atom, which is different from the repeating unit represented by General Formula (1).

14. A resist film formed from the actinic ray-sensitive or radiation-sensitive resin composition according to claim 3.

15. A pattern forming method comprising:
a step of forming a resist film using the actinic ray-sensitive or radiation-sensitive resin composition according to claim 3;
a step of exposing the resist film; and
a step of developing the exposed resist film using a developer.

16. A method for manufacturing an electronic device, comprising the pattern forming method according to claim 15.

17. The actinic ray-sensitive or radiation-sensitive resin composition according to claim 4,
wherein the acid-decomposable resin further has a repeating unit having a fluorine atom, which is different from the repeating unit represented by General Formula (1).

18. A resist film formed from the actinic ray-sensitive or radiation-sensitive resin composition according to claim 4.

19. A pattern forming method comprising:
a step of forming a resist film using the actinic ray-sensitive or radiation-sensitive resin composition according to claim 4;
a step of exposing the resist film; and
a step of developing the exposed resist film using a developer.

20. The actinic ray-sensitive or radiation-sensitive resin composition according to claim 1,
wherein the actinic ray-sensitive or radiation-sensitive resin composition comprises an acid diffusion control agent.

21. The actinic ray-sensitive or radiation-sensitive resin composition according to claim 20,
wherein the acid diffusion control agent is a basic compound (DA), a compound (DB) having basicity that is reduced or lost upon irradiation with actinic rays or radiation, or an onium salt (DC) which is a relatively weak acid with respect to the compound that generates an acid upon irradiation with actinic rays or radiation.

22. The actinic ray-sensitive or radiation-sensitive resin composition according to claim 1, wherein the repeating unit having a fluorine atom is a repeating unit having a fluorinated alcohol group.

* * * * *